(12) United States Patent
Toyama

(10) Patent No.: US 6,726,812 B1
(45) Date of Patent: *Apr. 27, 2004

(54) ION BEAM SPUTTERING APPARATUS, METHOD FOR FORMING A TRANSPARENT AND ELECTRICALLY CONDUCTIVE FILM, AND PROCESS FOR THE PRODUCTION OF A SEMICONDUCTOR DEVICE

(75) Inventor: Noboru Toyama, Hirakata (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/034,501

(22) Filed: Mar. 4, 1998

(30) Foreign Application Priority Data

Mar. 4, 1997 (JP) .............................. 9-049028

(51) Int. Cl.[7] .......................... C23C 14/00; C23C 14/32
(52) U.S. Cl. .............................. 204/192.11; 204/192.17; 204/192.23; 204/192.25; 204/192.26; 204/298.04; 204/298.06; 204/298.08
(58) Field of Search ................. 204/192.11, 192.25, 204/298.06, 298.08, 192.23, 192.17, 192.26, 298.04

(56) References Cited

U.S. PATENT DOCUMENTS

| | | | | |
|---|---|---|---|---|
| 4,033,843 A | * | 7/1977 | Krikorian et al. ............ 204/192 |
| 4,400,409 A | | 8/1983 | Izu et al. ....................... 427/39 |
| 4,731,540 A | * | 3/1988 | Schmidt .................... 250/492.2 |
| 4,747,922 A | * | 5/1988 | Sharp ..................... 204/192.11 |
| 5,184,018 A | | 2/1993 | Conrads et al. ............. 250/370 |
| 5,262,649 A | | 11/1993 | Antonuk et al. ............. 250/370 |
| 5,266,116 A | | 11/1993 | Fujioka et al. .............. 118/718 |
| 5,346,600 A | * | 9/1994 | Nieh et al. ................ 204/192.3 |
| 5,417,770 A | * | 5/1995 | Saitoh et al. ................ 136/258 |
| 5,658,438 A | * | 8/1997 | Givens et al. .......... 204/192.11 |

FOREIGN PATENT DOCUMENTS

JP 7331413 A 12/1995

* cited by examiner

Primary Examiner—Patrick Ryan
Assistant Examiner—Julian Mercado
(74) Attorney, Agent, or Firm—Fitzpatrick, Cella, Harper & Scinto

(57) ABSTRACT

An ion beam sputtering apparatus comprising: a first means for generating an ion beam and directing said ion beam in a prescribed direction, a second means for supporting a target at a position where said target is capable of exposing said ion beam irradiated in said prescribed direction and of being sputtered by said ion beam, a third means for supporting an electrically conductive substrate having a semiconductor layer on which a component sputtered from said target is to be deposited, and a fourth means for making said electrically conductive substrate have a non-earth potential. A method for forming a transparent and electrically conductive film on an electrically conductive substrate having a semiconductor layer, which is based on said ion beam sputtering apparatus. A process for producing a semiconductor device by forming a transparent and electrically conductive film on a semiconductor layer for said semiconductor device, which is based on said ion beam sputtering apparatus.

19 Claims, 8 Drawing Sheets

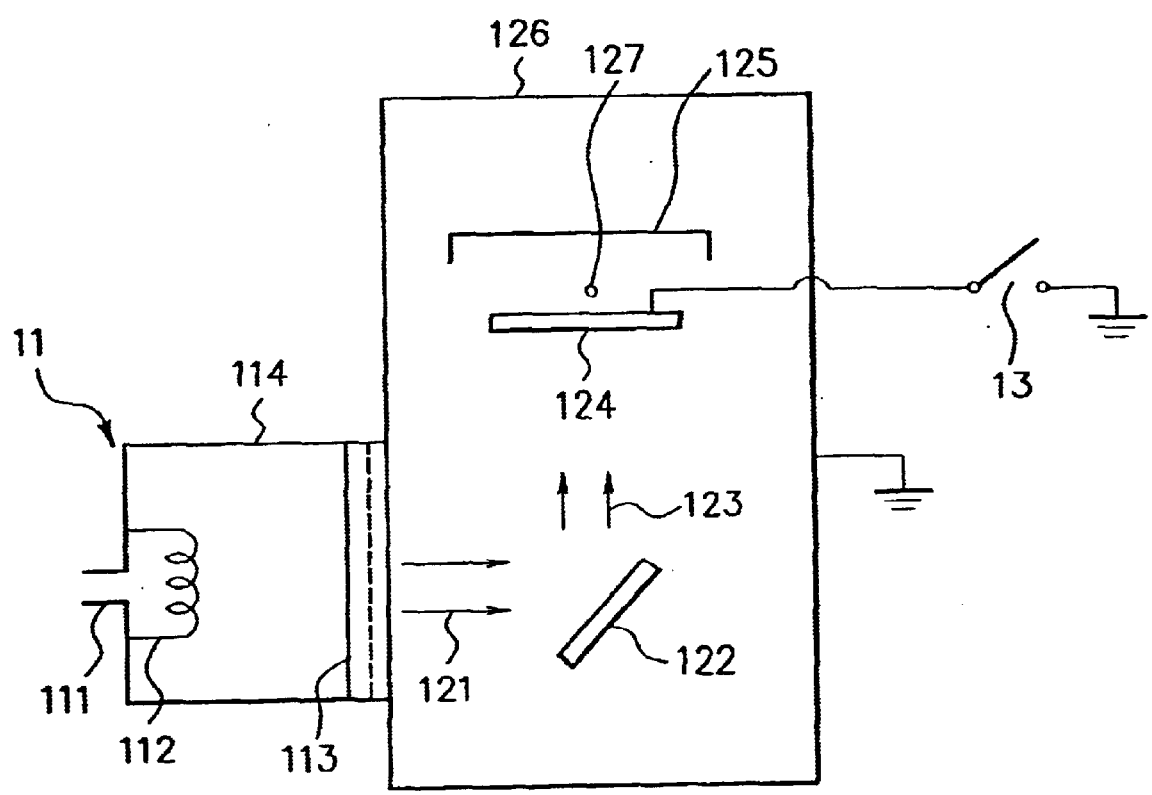
F I G. 1

ION BEAM SPUTTERING APPARATUS, METHOD FOR FORMING A TRANSPARENT AND ELECTRICALLY CONDUCTIVE FILM, AND PROCESS FOR THE PRODUCTION OF A SEMICONDUCTOR DEVICE

BACKGROUND OF THE INVENTION

1. Field of the Invention

The present invention relates to an improved ion beam sputtering apparatus suitable for forming an electrically conductive film on a semiconductor layer as a constituent in semiconductor devices including a photoelectric conversion device such as a photovoltaic element (or a solar cell), a line or area photosensor, and a thin film transistor (TFT), specifically said thin film semiconductor having one or more semiconductor junctions of pin, nip, pn, or np formed of a non-single crystalline silicon material such as an amorphous silicon (a-Si) material, a microcrystalline silicon ($\mu$c-Si) material or a polycrystalline silicon (poly-Si) material.

The present invention also relates to a method for forming a transparent and electrically conductive film on an improved electrically conductive substrate having a given semiconductor layer and a process producing a semiconductor device including a photoelectric conversion device such as a photovoltaic element (or a solar cell), a line or area photosensor and a thin film transistor (TFT), having an improved electrically conductive film.

2. Related Background Art

It is known that a thin film semiconductor device may be produced in a manner wherein a thin film semiconductor layer is formed on a substrate having an electrically conductive film formed thereon, an electrically conductive film is formed on said thin film semiconductor layer, followed by fabricating into an element. For instance, in the case of producing a photoelectric conversion device such as a solar cell (or a photovoltaic element), a thin film semiconductor layer having one or more semiconductor junctions of pin, nip pn, or np is formed on an electrically conductive surface of a substrate, and a transparent and electrically conductive film is formed on said thin film semiconductor layer.

It is known that the formation of such electrically conductive film on the thin film semiconductor layer may be conducted by way of vacuum evaporation or DC magnetron sputtering.

In the case of a photovoltaic element comprising a semiconductor layer having a desired semiconductor junction formed on an electrically conductive substrate through a light reflection layer and a transparent and electrically conductive film formed on said semiconductor layer, the transparent and electrically conductive film usually is comprised of $In_2O_3$, $SnO_2$, ZnO, or ITO ($In_2O_3+SnO_2$). The transparent and electrically conductive film comprising any of these materials may be formed by way of vacuum evaporation, sputtering, CVD or spraying process. Particularly, a transparent and electrically conductive film comprising ITO (hereinafter referred to as ITO film) excels in light-transmittance and electrical conductivity and has an excellent etching property. Because of this, the ITO film is widely used. For the formation of the ITO film, DC magnetron sputtering is frequently used in view of significance in the property of the film formed and also in the productivity.

Now, in order for the photovoltaic element to effectively exhibit a desirable electromotive force, the transparent and electrically conductive film used therein is required to have a desirably low electric resistance and a desirably high light-transmittance. However, in the case where an ITO film is formed on the semiconductor layer formed on the electrically conductive substrate through the light reflection layer at a thickness of 500 to 1000 Å which is suitable for the transparent and electrically conductive film on said semiconductor layer under conditions of a relatively low substrate temperature of 230° C. or less and a deposition rate of 10 Å/sec. or above which is desirable in terms of productivity, a sheet resistance of only about 50 Ω/□ can be attained for the resulting transparent and electrically conductive film.

Japanese Unexamined Patent Publication No. 331413/1995 (hereinafter referred to as Document 1) discloses a method of forming a transparent and electrically conductive film on a specific compound semiconductor layer of $CuInSe_2$ or the like having a homo junction formed on an electrically conductive substrate by sputtering a sintered ZnO target and a sintered $Al_2O_3$ in an atmosphere composed of $O_2$ gas or $H_2$ gas by way of ion beam sputtering using Ar ion beams.

The present inventor conducted experimental studies of the method described in Document 1. As a results, this method was found to still have such subjects as will be described in the following, which are necessary to be improved in order to form a desirable electrically conductive film on a given thin film semiconductor layer in accordance with the ion beam sputtering method described in Document 1.

That is, the results of experimental studies by the present inventor revealed such findings as will be described in the following. In the production of a photovoltaic element, when an ITO film as a transparent and electrically conductive film is formed on a thin film semiconductor layer formed of a non-single crystalline silicon material and having a pin junction formed on an electrically conductive substrate in accordance with the ion beam sputtering method described in Document 1, direct current (which is considered due to negative charge flown from the surface of the thin film semiconductor layer to the electrically conductive substrate) is liable to flow from the electrically conductive substrate toward the surface of the thin film semiconductor layer, where the direct current is converged at an electrically weak portion (which is rather lower in electric resistance than its periphery) to cause breakdown (short-circuit) in the thin film semiconductor layer situated in the vicinity of the electrically weak portion. This situation results in making the resulting photovoltaic element to have an insufficient performance which is poor in stability upon repeated use over a long period of time.

The present inventor conducted experimental studies of the reason why such short-circuit occurred in the thin film semiconductor layer. As a result, there were obtained such findings as will be described in the following. That is, particularly in the production of a photovoltaic element using a long substrate web made of stainless steel as an electrically conductive substrate, after a thin film semiconductor layer formed of a non-single crystalline silicon material and having a pin junction is formed on said long substrate web using the conventional roll-to-roll system, when an ITO film as a transparent and electrically conductive film is formed on the thin film semiconductor layer in accordance with the ion beam sputtering method described in Document 1 and using the conventional roll-to-roll system, problems are liable to entail in that since the supporting and transporting rollers of the roll-to-roll system are constituted by a metal which is electrically conductive, the substrate web (made of stainless steel) is eventually electrically grounded when it is contacted with the supporting and transporting rollers, where electric field is generated between the surface potential of the thin film semiconductor layer and the earth potential of the substrate web upon the ion beam sputtering to form the ITO film, the electric field is impressed into the thin film semiconductor layer wherein electric current is convergently flown through a portion having a lower electric resistance present in the thin film semiconductor layer from the substrate web (the electrically conductive substrate) toward the surface of the thin film semiconductor layer whereby causing such short-circuit as above described between the substrate web and the ITO film as the transparent and electrically conductive film formed on the thin film semiconductor layer. The resulting photovoltaic element becomes to have an insufficient performance which is poor in stability upon repeated use over a long period of time.

Herein, the ion beam sputtering is stronger than the DC magnetron sputtering and the like in terms of the intensity of plasma energy. Hence, the above problem of causing short-circuit is more liable to occur in the case of the ion beam sputtering in comparison with the case of the DC magnetron sputtering. In addition, in the case of the ion beam sputtering, the thin film semiconductor layer is more liable to suffer from plasma damage during the formation of the transparent and electrically conductive film thereon.

SUMMARY OF THE INVENTION

An object of the present invention is to provide an ion beam sputtering apparatus improved so as to effectively prevent the occurrence of the foregoing problem of causing such short-circuit in the prior art and a process which enables to efficiently produce a semiconductor device.

Another object of the present invention is to provide an improved ion beam sputtering apparatus in which a long electrically conductive substrate web having a semiconductor layer formed thereon can be effectively subjected to treatment by way of ion beam sputtering while continuously moving said substrate web and while preventing the semiconductor layer on the substrate web from suffering from plasma damage and a process which enables to effectively produce a high quality semiconductor device, said process including a step of forming a desirable electrically conductive film on the semiconductor layer formed on the substrate web by way of ion beam sputtering based on the ion beam sputtering apparatus.

A further object of the present invention is to provide an improved ion beam sputtering apparatus which enables to effectively form a transparent and electrically conductive film comprising grains having a substantially uniform size densely distributed therein and which has a desirably low electric resistance and a high light-transmittance, excels in acid proof and alkali proof, stands with high temperature, and is always stable even upon repeated use over a long period of time, and a process for producing a semiconductor device in which said transparent and electrically conductive film is used.

A further object of the present invention is to provide an ion beam sputtering apparatus comprising a first means for generating an ion beam and directing said ion beam in a prescribed direction, a second means for supporting a target at a position where said target is capable of exposing said ion beam irradiated in said prescribed direction and of being sputtered by said ion beam, a third means for supporting an electrically conductive substrate having a semiconductor layer on which a component sputtered from said target is to be deposited, and a fourth means for making said electrically conductive substrate to have a non-earth potential.

A further object of the present invention is to provide a method for forming a transparent and electrically conductive film on an electrically conductive substrate having a semiconductor layer thereon, said method comprising the steps of: arranging a target at a position in an ion beam sputtering apparatus where said target is irradiated with an ion beam, arranging said electrically conductive substrate at a position in said ion beam sputtering apparatus where a component sputtered from said target is deposited on said semiconductor layer of said electrically conductive substrate, and generating said ion beam and directing the ion beam generated in a prescribed direction to irradiate the ion beam to said target to sputter the target whereby depositing the component sputtered from the target on the semiconductor layer of the electrically conductive substrate whereby forming said transparent and electrically conductive film on the semiconductor layer, wherein at least during when the component sputtered from the target is being deposited on the semiconductor layer of the electrically conductive substrate, the electrically conductive substrate is controlled to a non-earth potential.

A further object of the present invention is to provide a process for producing a semiconductor device, comprising the steps of arranging a target at a position in an ion beam sputtering apparatus where said target is to be irradiated with an ion beam, arranging an electrically conductive substrate having a semiconductor layer for said semiconductor device at a position in said ion beam sputtering apparatus where a component sputtered from said target is to be deposited on said semiconductor layer on said electrically conductive substrate, and generating said ion beam and directing the ion beam generated in a prescribed direction to irradiate the ion beam to said target to sputter the target whereby depositing the component sputtered from the target on the semiconductor layer on the electrically conductive substrate, wherein at least during when the component sputtered from the target is being deposited on the semiconductor layer on the electrically conductive substrate, the electrically conductive substrate is controlled to a non-earth potential.

The semiconductor device herein includes a photoelectric conversion device such as a photovoltaic element or a solar cell, a line or area photosensor, and a thin film transistor (TFT).

BRIEF DESCRIPTION OF THE DRAWINGS

FIG. 1 is a schematic diagram illustrating an example of an ion beam sputtering apparatus according to the present invention.

DESCRIPTION OF THE INVENTION AND PREFERRED EMBODIMENTS

Figure 2:
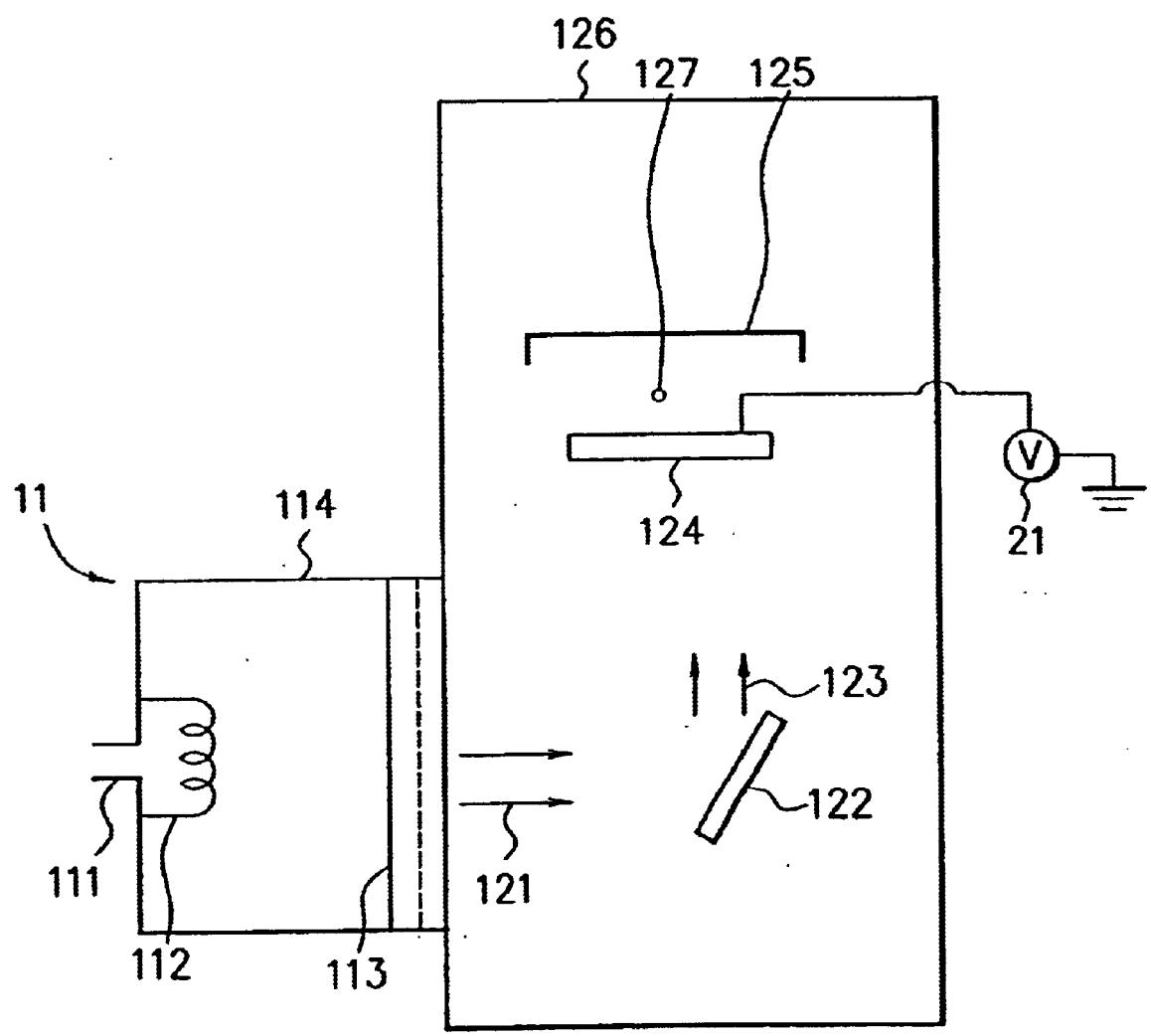
FIG. 2 is a schematic diagram illustrating another example of an ion beam sputtering apparatus according to the present invention.

The present invention is designed to eliminate the foregoing problems found in the prior art and to attain the above described objects.

As previously described, the present invention includes an ion beam sputtering apparatus, a method for forming a transparent and electrically conductive film on an electrically conductive substrate, and a process for producing a semiconductor device.

A typical embodiment of the ion beam sputtering apparatus according to the present invention comprises:

(a) a first means for generating an ion beam and directing said ion beam in a prescribed direction, (b) a second means for supporting a target at a position where said target is capable of exposing said ion beam irradiated in said prescribed direction and of being sputtered by said ion beam, (c) a third means for supporting an electrically conductive substrate having a semiconductor layer on which a component sputtered from said target is to be deposited, and (d) a fourth means for making said electrically conductive substrate to have a non-earth potential.

A typical embodiment of the method for forming a transparent and electrically conductive film is for forming an improved transparent and electrically conductive film on an electrically conductive substrate having a semiconductor layer thereon, said method comprising the steps of:

(a) arranging a target at a position in an ion beam sputtering apparatus where said target is irradiated with an ion beam, (b) arranging said electrically conductive substrate at a position in said ion beam sputtering apparatus where a component sputtered from said target is deposited on said semiconductor layer of said electrically conductive substrate, and (c) generating said ion beam and directing the ion beam generated in a prescribed direction to irradiate the ion beam to said target to sputter the target whereby depositing the component sputtered from the target on the semiconductor layer of the electrically conductive substrate whereby forming said transparent and electrically conductive film on the semiconductor layer, wherein at least during when the component sputtered from the target is being deposited on the semiconductor layer of the electrically conductive substrate in said step (c), the electrically conductive substrate is controlled to a non-earth potential.

The transparent and electrically conductive film formed according to this method comprises grains having a substantially uniform size densely distributed therein and which has a desirably low electric resistance and a high light-transmittance, excels in acid proof and alkali proof, stands with high temperature, and is always stable even upon repeated use over a long period of time.

A typical embodiment of the process for producing a semiconductor device according to the present invention comprises the steps of:

(a) arranging a target at a position in an ion beam sputtering apparatus where said target is to be irradiated with an ion beam, (b) arranging an electrically conductive substrate having a semiconductor layer for said semiconductor device at a position in said ion beam sputtering apparatus where a component sputtered from said target is to be deposited on said semiconductor layer on said electrically conductive substrate, and (c) generating said ion beam and directing the ion beam generated in a prescribed direction to irradiate the ion beam to said target to sputter the target whereby depositing the component sputtered from the target on the semiconductor layer on the electrically conductive substrate, wherein at least during when the component sputtered from the target is being deposited on the semiconductor layer on the electrically conductive substrate in said step (c), the electrically conductive substrate is controlled to a non-earth potential.

The term "semiconductor device" herein is meant to include a photoelectric conversion device such as a photovoltaic element or a solar cell, a line or area photosensor, and a thin film transistor (TFT).

In the following, the present invention will be described in more detail with reference to the drawings.

FIG. 1 is a schematic diagram illustrating an example of an ion beam sputtering apparatus according to the present invention.

The ion beam sputtering apparatus shown in FIG. 1 comprises an ion beam generating equipment 11 comprising a vacuum vessel 114, a deposition chamber or a vacuum chamber, 126 and a selector switch 13. The vacuum vessel 114 of the ion beam generating equipment 11 is provided with a gas supply pipe 111 for supplying Ar gas into the vacuum vessel 114. The gas supply pipe 111 is extending from a gas reservoir (not shown) containing Ar gas.

In the vacuum vessel 114, there are provided a heater 112 for exciting said Ar gas introduced thereinto to generate ions, and an accelerator 113 having a slit mechanism (not shown) for accelerating said ions into ion beams and ejecting said ion beams in a prescribed direction 121 into the vacuum chamber 126 of the deposition chamber 126.

The heater 112 is electrically connected to a power source (not shown). The vacuum vessel 114 is provided with an exhaust pipe (not shown) connected through an exhaustion valve (not shown) to a vacuum pump (not shown) in order to evacuate the inside of the vacuum vessel 114.

Reference numeral 122 indicates a target arranged at a position in the vacuum chamber 126 such that the target 122 effectively is irradiated with the ion beams ejected in the direction 121 (hereinafter the ion beams in the vacuum chamber 126 are denoted by reference numeral 121) from the vacuum chamber 114 of the ion beam generating equipment 11. Reference numeral 123 indicates a target component sputtered from the target 122 when the target 122 is irradiated with the ion beams 121. Reference numeral 124 indicates an electrically conductive substrate having a semiconductor layer formed thereon, which is arranged at a prescribed position in the vacuum chamber 126 such that the target component 123 is effectively deposited on the surface of the semiconductor layer of the electrically conductive substrate 124.

The semiconductor layer formed on the electrically conductive substrate 124 comprises a non-single crystalline silicon material and has one or more semiconductor junctions of pin, nip, pn, or np.

The vacuum chamber 126 is provided with a heater 125 for heating the electrically conductive substrate 124 and a thermocouple 127 for controlling the temperature of the electrically conductive substrate 124.

The vacuum chamber 126 is also provided with an exhaust pipe (not shown) connected through an exhaustion valve (not shown) to a vacuum pump (not shown) in order to evacuate the vacuum chamber 126.

The selector switch 13 is electrically connected to the electrically conductive substrate 124. The selector switch 13 has an on-off switching mechanism. When the deposition of the target component 123 on the semiconductor layer of the electrically conductive substrate 124 is conducted, the selector 13 is made OFF as shown in FIG. 1 to electrically insulate between the electrically conductive substrate 124 and earth potential. By this, a desirable transparent and electrically conductive film can be effectively formed on the semiconductor layer of the electrically conductive substrate 124.

FIG. 2 is a schematic diagram illustrating another example of an ion beam sputtering apparatus according to the present invention.

The ion beam sputtering apparatus shown in FIG. 2 is a partial modification of the ion beam sputtering apparatus shown in FIG. 1, in which the selector switch 13 of the ion beam sputtering apparatus shown in FIG. 1 is changed to a voltage applying means.

Particularly, the ion beam sputtering apparatus shown in FIG. 2 comprises an ion beam generating equipment 11 comprising a vacuum vessel 114, a deposition chamber or a vacuum chamber, 126 and a voltage applying means 21.

The vacuum vessel 114 of the ion beam generating equipment 11 is provided with a gas supply pipe 111 for supplying Ar gas into the vacuum vessel 114. In the vacuum vessel 114, there are provided a heater 112 for exciting said Ar gas introduced thereinto to generate ions, and an accelerator 113 having a slit mechanism for accelerating said ions into ion beams and ejecting said ion beams in a prescribed direction 121 into the vacuum chamber 126 of the deposition chamber 126. The heater 112 is electrically connected to a power source (not shown). The vacuum vessel 114 is provided with an exhaust pipe (not shown) connected through an exhaustion valve (not shown) to a vacuum pump (not shown) in order to evacuate the inside of the vacuum vessel 114.

In FIG. 2, reference numeral 122 indicates a target obliquely arranged at a position in the vacuum chamber 126 such that the target 122 effectively is irradiated with the ion beams ejected in the direction 121 (hereinafter the ion beams in the vacuum chamber 126are denoted by reference numeral 121) from the vacuum vessel 114 of the ion beam generating equipment 11. Reference numeral 123 indicates a target component sputtered from the target 122 when the target 122 is irradiated with the ion beams 121. Reference numeral 124 indicates an electrically conductive substrate having a semiconductor layer formed thereon, which is arranged at a prescribed position in the vacuum chamber 126 such that the target component 123 is effectively deposited on the surface of the semiconductor layer of the electrically conductive substrate 124.

As well as in the case of FIG. 1, the semiconductor layer formed on the electrically conductive substrate 124 comprises a non-single crystalline silicon material and has one or more semiconductor junctions of pin, nip, pn, or np.

The vacuum chamber 126 in the apparatus shown in FIG. 2 is provided with a heater 125 for heating the electrically conductive substrate 124 and a thermocouple 127 for controlling the temperature of the electrically conductive substrate 124.

The vacuum chamber 126 is also provided with an exhaust pipe (not shown) connected through an exhaustion valve (not shown) to a vacuum pump (not shown) in order to evacuate the inside of the vacuum chamber 126.

The voltage applying means 21 in the apparatus shown in FIG. 2 is electrically connected to the electrically conductive substrate 124. The voltage applying means 21 serves to control the electrically conductive substrate 124 such that it has a voltage of −100 to 0 volt to the earth, during when the deposition of the target component 123 on the semiconductor layer of the electrically conductive substrate 124 is conducted.

In the ion beam sputtering apparatus shown in FIG. 2, the electrically conductive substrate 124 may be supported on an electrically insulative substrate holder (not shown) made of, for example, alumina. By this, the electrically conductive substrate 124 is made to be in an electrically insulated state to the earth potential of the vacuum chamber 126 and the like.

In the ion beam sputtering apparatus shown in FIG. 2, during when the ion beam sputtering to deposit the target component 123 on the semiconductor layer of the electrically conductive substrate 124 is conducted, the surface of the semiconductor layer is made have a negative potential to earth and, to the electrically conductive substrate 124, there is applied a voltage preferably in the range of −100 to 0 volt, more preferably in the range of −60 to 0 volt, or most preferably in the range of −40 to 0 volt respectively versus to earth, by means of the voltage applying means 21. By this, a desirable transparent and electrically conductive film can be effectively formed on the semiconductor layer of the electrically conductive substrate 124.

The results of the experimental studies by the present inventor revealed a fact that when the voltage applied to the electrically conductive substrate 124 by means of the voltage applying means 21 is excessively small, namely smaller than −100 volt, the surface of the semiconductor layer suffers from plasma damage.

Figure 3:
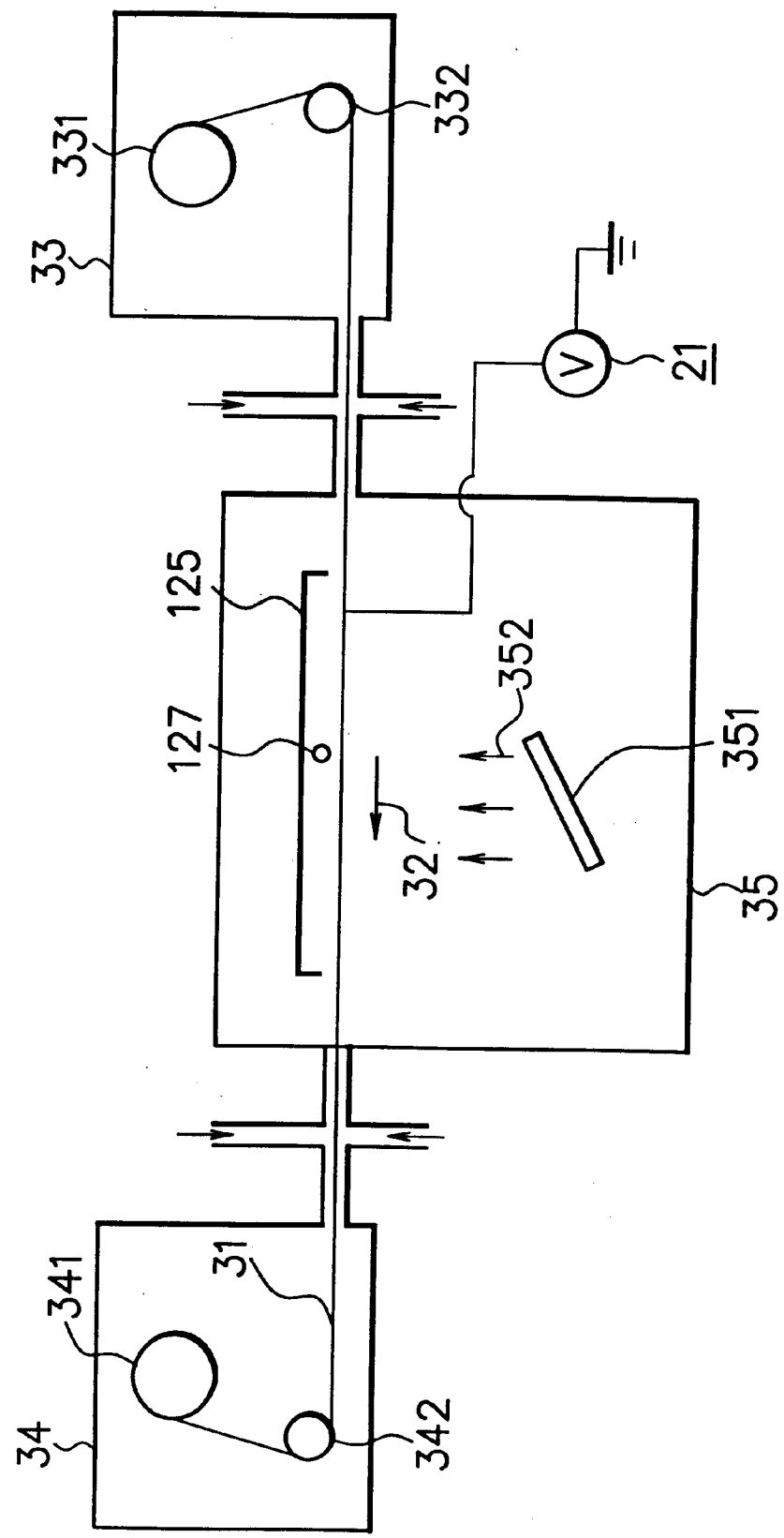
FIG. 3 is a schematic diagram illustrating a further example of an ion beam sputtering apparatus according to the present invention.

FIG. 3 is a schematic diagram illustrating a further example of an ion beam sputtering apparatus according to the present invention.

The ion beam sputtering apparatus shown in FIG. 3 is of the roll-to-roll system, and it comprises a load chamber 33 (capable of being vacuumed) for paying out an electrically conductive substrate web 31 (made of a metallic such as stainless steel) having a semiconductor layer formed thereon, a deposition vacuum chamber 35 for conducting film formation on the semiconductor layer of the electrically conductive substrate web 31 by way of ion beam sputtering, and an unload chamber 34 (capable of being vacuumed) for taking up the electrically conductive substrate web 31.

The deposition vacuum chamber 35 has such ion beam generating equipment as shown in FIG. 2 (not shown in FIG. 3) which is connected to the deposition vacuum chamber in the same manner as in FIG. 2.

The load chamber 33 is connected to the deposition vacuum chamber 35 through a gas gate. The unload chamber 34 is also connected to the deposition vacuum chamber 35 through a gas gate. Each of the gas gates serves as a passage for transporting the electrically conductive substrate web 31 from the load chamber 33 to the deposition chamber 35 or from the deposition chamber 35 to the unload chamber 34 while preventing gas diffusion from the deposition chamber 35 to the load or unload chamber. As the gate gas used in each gas gate, there is used inert gas such as Ar gas. Each of the load chamber 33 and the unload chamber 34 is provided with an exhaust pipe (not shown) connected to a vacuum pump so that it can be evacuated.

As well as in the case of the deposition chambers 126 in FIG. 1 or 2, the deposition chamber 35 is also provided with an exhaust pipe (not shown) connected through an exhaustion valve (not shown) to a vacuum pump (not shown).

The load chamber 33 contains a pay-out reel 331 having the substrate web 31 wound thereon and a feed roller 332. The pay-out reel 331 in the load chamber 33 is held on a rotary shaft (not shown) connected to a driving means (not shown). The unload chamber 34 contains a take-up reel 341 held on a rotary shaft (not shown) connected to a driving means (not shown) and a feed roller 342.

The substrate web 31 paid out from the pay-out reel 331 in the load chamber 33 is guided by the feed roller 332 to pass through the vacuum isolating means (not shown) between the load chamber 33 and the deposition vacuum chamber 35, the deposition vacuum chamber 35, the vacuum isolating means (not shown) between the deposition vacuum chamber 35 and the unload chamber 34, and it is fixed to the take-up reel 341 in the unload chamber 34 while being guided by the feed roller 342. Wherein, the substrate web 31 is made such that it is horizontally moved in a direction shown by an arrow mark 32 from the load chamber 33 toward the unload chamber 34 while adjusting the substrate web 31 not to have any loosing part.

The semiconductor layer formed on the electrically conductive substrate web 31 has, for instance, one or more semiconductor junctions comprising a non-single crystalline silicon material. The formation of such semiconductor layer on the electrically conductive substrate web 31 may be conducted, for instance, in accordance with such roll-to-roll film-forming manner by way of plasma CVD as described, for instance, in U.S. Pat. No. 4,400,409 or U.S. Pat. No. 5,266,116. The roll-to-roll film forming manner herein is meant a film-forming manner wherein an electrically conductive substrate web is passed through a plurality of plasma CVD film-forming chambers connected to each other through diffusion preventive means such as gas gate, where a given semiconductor layer comprising a non-single crystalline silicon material such as an amorphous silicon (a-Si) material, microcrystalline silicon ($\mu$c-Si) material or polycrystalline silicon (poly-Si) material is formed on the electrically conductive substrate web in each film-forming chamber whereby forming a multi-layered semiconductor layer having one or more semiconductor junctions of pin, nip, pn, or np on the electrically conductive substrate web.

Now, in the deposition vacuum chamber 35 having the ion beam generating equipment (not shown), the electrically conductive substrate web 31 having the semiconductor layer thereon is subjected to formation of a transparent and electrically conductive film on the semiconductor layer of the electrically conductive substrate web.

Herein, the deposition vacuum chamber 35 is provided with a heater 125 for heating the electrically conductive substrate web 31 and a thermocouple 127 for controlling the temperature of the electrically conductive substrate web 31 as well as in the case of FIG. 2. Reference numeral 351 indicates a target. Reference numeral 352 indicates a target component sputtered from the target 351 when the target 351 is irradiated with ion beams ejected from the ion beam generating equipment (not shown) in the same manner as in the case of FIG. 2. The target component 352 thus sputtered from the target 351 is deposited on the surface of the semiconductor layer of the electrically conductive substrate web 31 to cause the formation of a transparent and electrically conductive film on the semiconductor layer.

As well as in the case of FIG. 2, reference numeral 21 indicates a voltage applying means which is electrically connected to the electrically conductive substrate web 31. The voltage applying means 21 serves to control the electrically conductive substrate web 31 such that it has a voltage of −100 to 0 volt to earth, during when the deposition of the target component 352 on the semiconductor layer of the electrically conductive substrate web 31 is conducted.

In the ion beam sputtering apparatus shown in FIG. 3, in order to electrically insulate the electrically conductive substrate 31 to the earth potential of the deposition chamber 35 and the like, the surface of each of the pay-out reel 331, the feed rollers 332 and 342, and the take-up reel 341, which is contacted with the electrically conductive substrate 31, is covered by an insulative film of polyimide affixed thereon using a double-coated adhesive tape. As the insulative film herein, besides the polyimide film, insulative members comprising fluororesins such as Teflon (trademark), papers or the like are also usable. It is possible for the surface of each of these reels and rollers to be coated by an appropriate insulative material such as paint. Further, the surface of each of these reels and rollers may be impregnated with an insulative resin such as Teflon. Alternatively, each of the pay-out reel 331, the feed rollers 332 and 342, and the take-up reel 341 may be constituted by an insulative resin such as Teflon or Delrin (trademark name). Teflon (TEFLON) is a trademark of the DuPont company for fluorocarbon polymers, as polytetrafluoroethylene. Delrin (DELRIN) is a trademark of the DuPont company for heat-resistant, stabilized acetal resins, as polyoxymethylene (polyacetal). It is possible that some of these insulating manners are combined.

By this, the electrically conductive substrate web 31 is made to be in an electrically insulated state to the earth potential of the deposition vacuum chamber 35 and the like.

In the ion beam sputtering apparatus shown in FIG. 3, during when the ion beam sputtering to deposit the target component 352 on the semiconductor layer of the electrically conductive substrate web 31 is conducted, it is possible for the electrically conductive substrate web 31 to be in a state of connecting to non-earth potential by applying an appropriate voltage to the electrically conductive substrate web 31 by means of the voltage applying means 21. The voltage applied to the electrically conductive substrate web 31 by means of the voltage applying means 21 in this case is desired to be in the range of −100 volts to 0 volt, which is substantially the same level as the self-bias voltage (V-self) between the electrically conductive substrate web and the earth potential of the deposition chamber 35, which is generated upon conducting the ion beam sputtering. The voltage applied by the voltage applying means 21 in this case is preferred to be of DC (direct current). However, it is possible to use AC (alternate current) or RF together with the DC.

Now, the ion beam generation in any of the ion beam sputtering apparatus shown in FIGS. 1 to 3 is conducted using an ion source of hot-cathode electron impact. In any case, ion beams generated are impinged to the target obliquely arranged in the deposition chamber (126, 35), where the target is sputtered by the ion beams. A preferable example of the target, there can be mentioned a pellet-like shaped ITO target comprising, for example, a sintered compact of a mixture composed of $In_2O_3$ (90 wt. %) and $SnO_2$ (10 wt. %). The pellet-like shaped ITO target is desired to have a relative density of preferably 65% or more, more preferably 70% or more, most preferably 80% or more. Besides, it is possible to use a pellet-like shaped target comprising $SnO_2$, $In_2O_3$, ZnO, or the like as the above target.

Alternatively, it is possible that instead of the above described metal oxide targets, a metal pellet of InSn, Zn, or the like is used, and oxygen gas is used as a reaction gas, whereby forming a transparent and electrically conductive metal oxide film.

In any of the ion beam sputtering apparatus shown in FIGS. 1 to 3, the voltage as a self-bias voltage (V-self) between the electrically conductive substrate (124, 31) and the deposition chamber (126, 35) during the formation of the transparent and electrically conductive film on the semiconductor layer by the ion beam sputtering is measured by means of a voltmeter. The self-bias voltage (V-self) is desired to be controlled such that it falls in the range of −100 volts≦V-self<0 volt. In order to satisfy this requirement, the related sputtering conditions such as ion beam current, film-forming pressure (the gas pressure in the deposition chamber), oxygen partial pressure, distance between the electrically conductive substrate and the target, ion inducing voltage are properly controlled. Specifically, for the ion beam current, it is desired to be in the range of 1 to 100 A. For the film-forming pressure (the gas pressure in the deposition chamber), it is desired to be in the range of $3 \times 10^{-5}$ to $1 \times 10^{-2}$ Torr. For the oxygen partial pressure, it is desired to be in the range of 0 to $5 \times 10^{-4}$ Torr. For the distance between the electrically conductive substrate and the target, it is desired to be in the range of 50 to 800 mm. For the ion inducing voltage, it is desired to be in the range of 0.2 to 30 kV.

In order to minimize plasma damage due to ion to the semiconductor layer on the electrically conductive substrate, the above self-bias voltage (V-self) is desired to be preferably in the range of −60 volts<V-self<0 volt, or more preferably in the range of −40 volts<V-self<0 volt, by properly controlling the foregoing sputtering conditions in the above described ranges.

In the ion beam sputtering apparatus (shown in FIGS. 1 to 3) according to the present invention, as the heater 125 for heating the electrically conductive substrate (124, 31) during the film formation, there can be used a sheath heater, infrared ray lamp, or the like. During the film formation, by means of the heater 125, the electrically conductive substrate (124, 31) is heated to and maintained at a desired temperature while observing a value indicated by the thermocouple 127 positioned just above the electrically conductive substrate (124, 31).

As the electrically conductive substrate used in the present invention, there can be mentioned, typically for example, a stainless steel (SUS 430 BA) plate of 0.2 mm in thickness and having a surface applied with BA treatment (bright anneal treatment) in inert gas in the case of the ion beam sputtering apparatus shown in FIG. 1 or 2, and a long substrate web made of stainless steel (SUS 430 BA) of 0.2 mm in thickness and having a surface applied with the above BA treatment in the case of the ion beam sputtering apparatus shown in FIG. 3. These are only typical examples and they are not limitative. The surface treatment for the electrically conductive substrate is not limited to the BA treatment. Surface treatment comprising a combination of cold pressure welding, heat treatment and acid washing treatment may be employed. As an example in this case, there be mentioned a No. 2D steel plate or web having an uneven surface having irregularities comprising stripes formed in a manner in which after cold pressure treatment, heat treatment and acid washing treatment are sequentially conducted.

Besides, a galvanized steel plate or web, an aluminum plate or web, a plated steel plate or web, and a metal-plated plastic film respectively having an uneven surface are also usable.

The electrically conductive substrate (124, 31) may have a reflection layer comprising a metal film of Al, Ag, Ni, or Cu between the semiconductor layer and the substrate. Further, on such reflection layer, it is possible to have a transparent and electrically conductive film (as a lower transparent and electrically conductive film) comprising a film of ZnO or ITO. The reflection layer and the lower transparent and electrically conductive film are desired to be formed by way of DC magnetron sputtering.

For the semiconductor layer formed on the electrically conductive substrate (124, 31), it is meant a semiconductor layer having one or more semiconductor junctions of, for instance, pin, nip, pn, or np used in a semiconductor device including a photoelectric conversion device such as a photovoltaic element (a solar cell), a line or area photosensor, and a thin film transistor (TFT).

As representative examples of such photovoltaic element, there can be mentioned photovoltaic elements having a semiconductor layer of a stacked structure comprising one or more cells each having a semiconductor junction of pin, nip, pn, or np. The semiconductor layer having such stacked structure is constituted by a non-single crystalline silicon material such as an amorphous silicon (a-Si) material, a microcrystalline silicon ($\mu$c-Si), or a polycrystalline silicon (poly-Si) material. The semiconductor layer may be desirably formed by way of plasma CVD such as high frequency plasma CVD, microwave plasma CVD, or the like.

Figure 4:
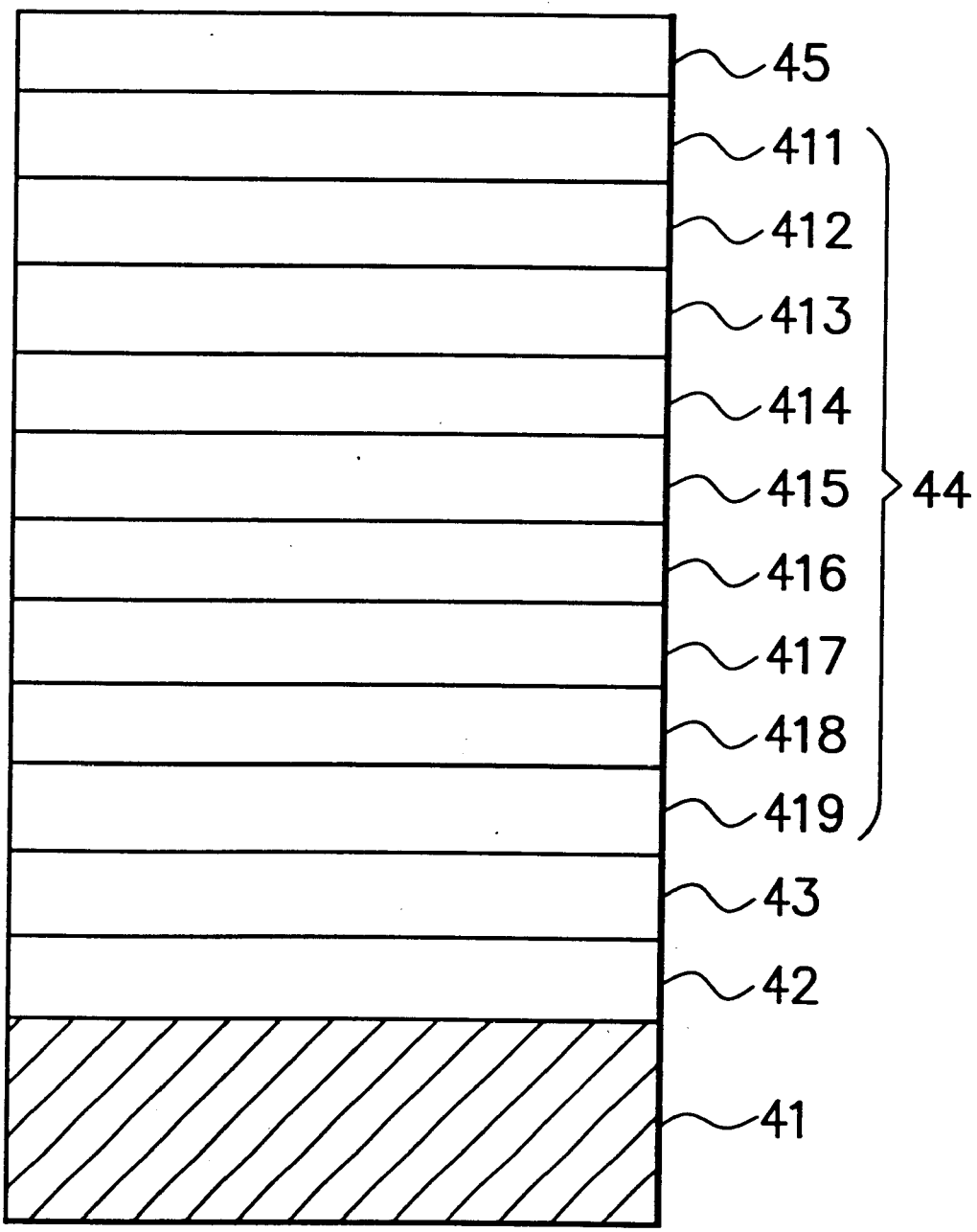
FIG. 4 is a schematic cross-sectional view illustrating the constitution of an example of a semiconductor device according to the present invention.

FIG. 4 is a schematic cross-sectional view illustrating a triple cell type photovoltaic element having a semiconductor layer of a stacked structure comprising three cells each having a nip junction as an example of such photovoltaic element.

The photovoltaic element shown in FIG. 4 comprises an electrically conductive substrate 41 [corresponding to the foregoing electrically conductive substrate (124, 31)], a semiconductor layer 44 (corresponding to the semiconductor layer previously described in the case of each of the ion beam sputtering apparatus shown in FIGS. 1 to 3) formed on the electrically conductive substrate 41, and an upper transparent and electrically conductive film (corresponding to the foregoing transparent and electrically conductive film formed according to the present invention) formed on the semiconductor layer 44.

Between the electrically conductive substrate 41 and the semiconductor layer 44, there are interposed a reflection layer 42 (comprising a metal film of Al, Ag, Ni or Cu) and a lower transparent and electrically conductive film 43 (comprising a zinc oxide film or an ITO film) which are stacked in this order from the side of the electrically conductive substrate 41.

The semiconductor layer 44 has a stacked structure comprising three cells each having a nip junction.

Particularly, the semiconductor layer 44 comprises a bottom cell having a nip junction comprising an n-type semiconductor layer 419, an i-type semiconductor layer 418 and a p-type semiconductor layer 417 stacked in this order from the side of the substrate 41; a middle cell comprising an n-type semiconductor layer 416, an i-type semiconductor layer 415 and a p-type semiconductor layer 414 stacked in this order from the side of the substrate 41; and a top cell comprising an n-type semiconductor layer 413, an i-type semiconductor layer 412 and a p-type semiconductor layer 411 stacked in this order from the side of the substrate 41, wherein each of the n-type semiconductor layers 419, 416 and 413 comprises an n-type a-Si semiconductor material formed from a mixture of $SiH_4$, $PH_3$ and $H_2$ by way of RF plasma CVD; each of the i-type semiconductor layers 418 and 415 comprises an i-type a-SiGe semiconductor material formed from a mixture of $SiH_4$, $GeH_4$ and $H_2$ by way of microwave plasma CVD; the i-type semiconductor 412 comprises an i-type a-Si semiconductor material formed from a mixture of $SiH_4$ and $H_2$ by way of microwave plasma CVD; and each of the p-type semiconductor layers 417, 414 and 411 comprises a p-type μc-Si semiconductor material formed from a mixture of $SiH_4$, $BF_3$ and $H_2$ by way of RF plasma CVD.

In the following, description will be made of a method of forming a transparent and electrically conductive film using the ion beam sputtering apparatus according to the present invention which is shown in FIG. 1.

First, there is provided an electrically conductive substrate having a semiconductor layer formed of a non-single crystalline silicon material and having one or more semiconductor junctions of pin, nip, pn, or np as the electrically conductive substrate 124.

The electrically conductive substrate 124 is fixed on an electrically insulative substrate holder (not shown) made of alumina in the deposition chamber 126 of the ion beam sputtering apparatus.

By measuring the electric resistance between the electrically conductive substrate 124 and the deposition chamber 126 using a tester, it is confirmed that the electrically conductive substrate is in an electrically insulated state to the earth potential of the deposition chamber 126 and the like. In this case, it is desired for the electric resistance between the electrically conductive substrate 124 and the deposition chamber 126 to be as higher as possible, in order to diminish the quantity of electric current flown to the electrically conductive substrate. For the electric resistance between the electrically conductive substrate 124 and the deposition chamber 126, it is preferably 300 kΩ or more, more preferably 600 kΩ or more, most preferably 800 kΩ or more.

Then, the inside of the vacuum vessel 114 of the ion beam generating equipment 11 is evacuated to a desired vacuum, followed by further evacuating to a high vacuum, through the exhaust pipe (not shown) having the exhaustion valve (not shown) provided at the vacuum vessel 114, by actuating the vacuum pump (not shown) connected to the exhaust pipe.

Thereafter, Ar gas is introduced into the vacuum vessel 114 through the gas supply pipe 111. In this case, the inside of the deposition chamber 126 is also evacuated to and maintained at a desired vacuum through the exhaust pipe (not shown) having the exhaustion valve (not shown) provided at the deposition chamber 126 by actuating the vacuum pump (not shown) connected to the exhaust pipe. And the electrically conductive substrate 124 in the deposition chamber 126 is heated to maintained at a desired temperature using the heater 125 and the thermocouple 127.

Then, the heater 112 in the vacuum vessel 114 is energized by the power source (not shown) electrically connected to the heater 112, where the Ar gas introduced into the vacuum vessel 114 is excited to generate Ar ions. The Ar ions generated successively flow to pass through the accelerator 113 having the slit mechanism where they are accelerated into Ar ion beams, which are followed by ejecting into the deposition chamber 126. The Ar ion beams thus ejected into the deposition chamber 126 are impinged to the target 122, where the target is sputtered by the Ar ion beams to produce a target component, which is followed by reaching to the electrically conductive substrate 124, where the target component is deposited to cause the formation of a transparent and electrically conductive film on the semiconductor layer formed on the electrically conductive substrate 124.

In the above, by adjusting the related factors including ion inducing voltage and ion beam current in the ion beam generating equipment 11 by controlling the power applied to the heater 112 and also by adjusting the flow rate of the Ar gas introduced into the vacuum vessel 114 or/and the opening of the exhaustion valve of the vacuum vessel 114, the film-forming pressure (the gas pressure) in the deposition chamber 126 is controlled to a desired value while maintaining the self-bias voltage between the electrically conductive substrate 124 and the deposition chamber 126 at a desired value. By this, a desirable transparent and electrically conductive film having a desired thickness can be formed on the semiconductor layer of the electrically conductive substrate 124.

In the following, the present invention will be described in more detail with reference to examples, which are only for illustrative purposes but not intended to restrict the scope of the present invention to these examples.

EXAMPLE 1

In this example, there were prepared a plurality of triple cell type photovoltaic elements having such configuration as shown in FIG. 4 using the ion beam sputtering shown in FIG. 2.

1. Provision of Electrically Conductive Substrate 124:

There were provided eleven well-cleaned substrates (41, see FIG. 4) made of stainless steel (SUS 430 BA) of 0.2 mm in thickness and 50 mm×50 mm in size and having an uneven surface applied with bright anneal treatment. On the uneven surface of each of the eleven electrically conductive substrate, there was formed a 100 nm thick Al film as a reflection layer (42) by means of the conventional sputtering process, followed by forming a 1 μm thick ZnO film as a lower transparent and electrically conductive film (43) by means of the conventional DC magnetron sputtering process.

Each of the eleven electrically conductive substrates having the reflection layer (42) and the lower transparent and electrically conductive film (43) thereon was introduced into the conventional multi-chambered plasma CVD apparatus, wherein on the lower transparent and electrically conductive film (43), there was formed a multi-layered semiconductor layer (44) having a bottom cell comprising a 10 nm thick n-type a-Si semiconductor layer (419)/a 200 nm thick i-type a-SiGe semiconductor layer (418)/a 5 nm thick p-type μc-Si semiconductor layer (417), a middle cell comprising a 10 nm thick n-type a-Si semiconductor layer (416)/a 100 nm thick i-type a-SiGe semiconductor layer (415)/a 5 nm thick p-type μc-Si semiconductor layer (414), and a top cell comprising a 10 nm thick n-type a-Si semiconductor layer (413)/a 70 nm thick i-type a-Si semiconductor layer (412)/a 5 nm thick p-type μc-Si semiconductor layer (411) being stacked in the named order from the substrate side by means of the conventional plasma CVD process. Wherein, the n-type a-Si semiconductor layer in each of the three cells was formed from a mixture of $SiH_4$ gas, $PH_3$ gas and $H_2$ gas by means of RF plasma CVD; the p-type μc-Si semiconductor layer in each of the three cells was formed from a mixture of $SiH_4$ gas, $BF_3$ gas and $H_2$ gas by means of RF plasma CVD; the i-type a-SiGe semiconductor layer in each of the bottom and middle cells was formed from a mixture of $SiH_4$ gas, $GeH_4$ gas and $H_2$ gas by means of microwave plasma CVD; and the i-type a-Si semiconductor layer in the top cell was formed from a mixture of $SiH_4$ gas, and $H_2$ gas by means of microwave plasma CVD.

Thus, there were provided eleven stainless steel substrates each having the above-described semiconductor layer (44) thereon as the electrically conductive substrate 124.

2. Formation of Transparent and Electrically Conductive Film:

On the semiconductor layer (44) of each of the eleven electrically conductive substrates 124, an about 70 nm thick transparent and electrically conductive film (45) comprising ITO was formed using the ion beam sputtering apparatus shown in FIG. 2 in which the target 122 comprises a pellet-like shaped target comprising a sintered compact of a mixture composed of $In_2O_3$ (90 wt. %) and $SnO_2$ (10 wt. %).

The formation of transparent and electrically conductive film (45) on the semiconductor layer (44) of each of the eleven electrically conductive substrates 124 was conducted by changing the self-bias voltage (V-self) between the electrically conductive substrate 124 and the deposition chamber 12 in the range of −120 volts to +20 volts as shown in Table 1.

The formation of the transparent and electrically conductive film (45) on the semiconductor layer (44) of each of the electrically conductive substrates 124 using the ion beam sputtering apparatus shown in FIG. 2 was conducted as will be described in the following.

(1). The electrically conductive substrate 124 was fixed on an electrically insulative substrate holder (not shown) made of alumina in the deposition chamber 126 of the ion beam sputtering apparatus. The deposition chamber 126 was made to be in an electrically floated state.

(2). The electric resistance between the electrically conductive substrate 124 and the deposition chamber, 126 was measured using a tester. As a result, the electric resistance between the electrically conductive substrate 124 and the deposition chamber 126 was found to be more than 300 kΩ. By this, the electrically conductive substrate was found to be in an electrically insulated state to the earth potential of the deposition chamber 126 and the like.

(3). The inside of the vacuum vessel 114 of the ion beam generating equipment 11 was evacuated to a desired vacuum, followed by further evacuating to a high vacuum of about $10^{-6}$ Torr, through the exhaust pipe (not shown) having the exhaustion valve (not shown) provided at the vacuum vessel 114, by actuating the vacuum pump (not shown) connected to the exhaust pipe. Thereafter, Ar gas was introduced into the vacuum vessel 114 through the gas supply pipe 111.

(4). The deposition chamber 126 was also evacuated to and maintained at a desired vacuum through the exhaust pipe (not shown) having the exhaustion valve (not shown) provided at the deposition chamber 126 by actuating the vacuum pump (not shown) connected to the exhaust pipe. And the electrically conductive substrate 124 in the deposition chamber 12 was heated to maintained at 190° C. using the heater 125 and the thermocouple 127.

(5). The heater 112 in the vacuum vessel 114 was energized by the power source (not shown) electrically connected to the heater 112, where the Ar gas introduced into the vacuum vessel 114 was excited to generate Ar ions, the Ar ions generated were successively flown to pass through the accelerator 113 having the slit mechanism where they were accelerated into Ar ion beams, which were followed by ejecting into the deposition chamber 126. The Ar ion beams thus ejected into the deposition chamber 126 were successively impinged to the target 122, where the target was sputtered by the Ar ion beams to produce a target component, which was followed by reaching to the electrically conductive substrate 124, where the target component was deposited to cause the formation of a transparent and electrically conductive film (45) on the semiconductor layer (44) of the electrically conductive substrate 124.

In the above film-forming process in each case, the film-forming pressure (the gas pressure) in the deposition chamber 12 was made to be a gas pressure of $1×10^{-5}$ Torr, $2×10^{-5}$ Torr, $3×10^{-5}$ Torr, $5×10^{-5}$ Torr, $8×10^{-5}$ Torr, $2×10^{-4}$ Torr, $5×10^{-4}$ Torr, or $5×10^{-3}$ Torr as shown in Table 1 by adjusting the ion inducing voltage and ion beam current by controlling the power applied to the heater 112 and also by adjusting the flow rate of the Ar gas introduced into the vacuum vessel 114 or/and the opening of the exhaustion valve of the vacuum vessel 114, while making the self-bias voltage (V-self) between the electrically conductive substrate 124 and the deposition chamber 126 to be a different V-self of −120 volts, −110 volts, −100 volts, −80 volts, −60 volts, −40 volts, −20 volts, −5 volts, 0 volt (the same as the earth potential), +5 volts, or +20 volts as shown in Table 1 by applying a prescribed DC voltage to the electrically conductive substrate 124 by means of the voltage applying means 21.

In this way, there were prepared eleven photovoltaic elements having the configuration shown in FIG. 4.

For each of the resultant eleven photovoltaic elements, its open-circuit voltage (Voc) under condition of irradiating light from a fluorescent lamp of 200 lux was measured in accordance the conventional measuring manner of open-circuit voltage. The measured results obtained are graphically shown in FIG. 5.

(6). On the surface of the transparent and electrically conductive film (45) of each of the eleven photovoltaic elements obtained in the above step (5), there was formed a comb-shaped collecting electrode by screen-printing an Ag-paste thereon. By this, there were obtained eleven solar cells.

For each of the resultant eleven solar cells, its photovoltaic conversion efficiency (after having been once light-degraded) under condition of irradiating pseudo sunlight of AM 1.5 (100 mW/cm²) was measured in accordance with the conventional measuring manner of photoelectric conversion efficiency. The measured results obtained are graphically shown in FIG. 6.

Figure 5:
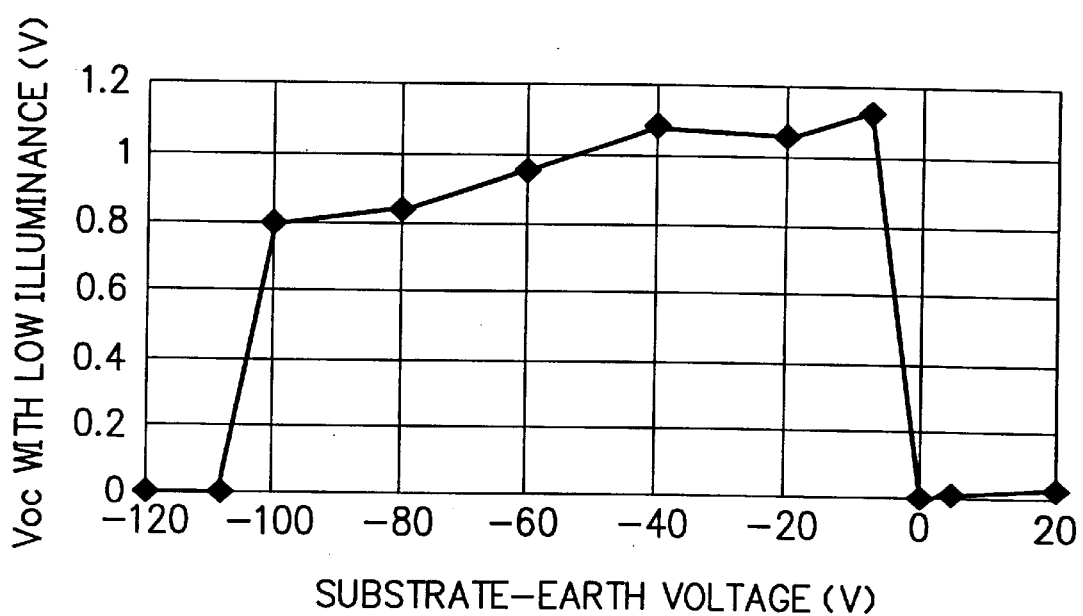
FIG. 5 is a graph showing open-circuit voltages (Voc) of photovoltaic elements obtained in Example 1 which will be described later.
Figure 6:
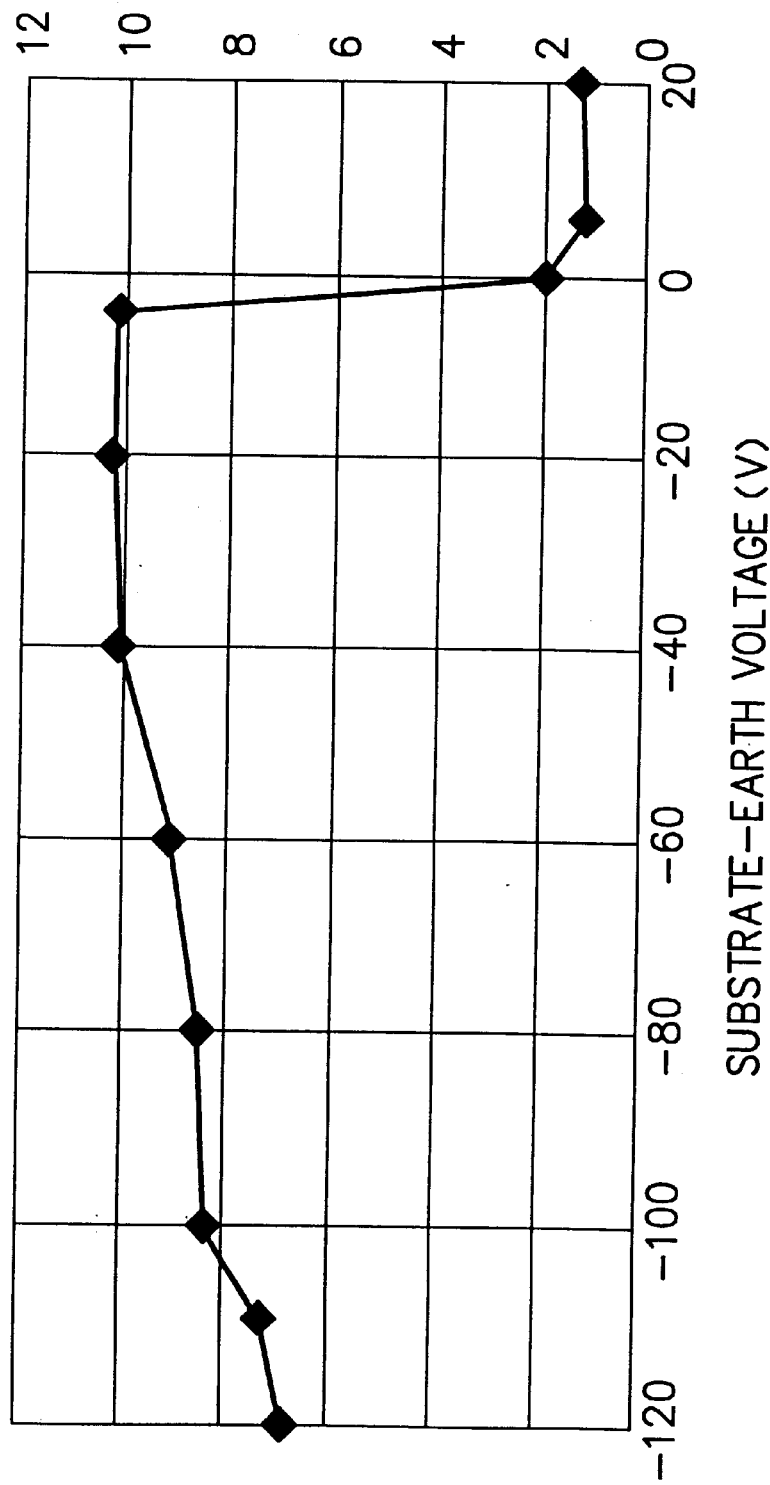
FIG. 6 is a graph showing photoelectric conversion efficiencies of photovoltaic elements obtained in Example 1 which will be described later.

3. Total Evaluation:

Based on the results shown in FIGS. 5 and 6, the following facts are understood.

For the photovoltaic elements (the solar cells) prepared by making the self-bias voltage (V-self) between the electrically conductive substrate 124 and the deposition chamber 126 to be 0 volt (that is, the same as the earth potential) or more, specifically in the range of 0 volt to +20 volts, any of them is significantly interior in the characteristics required for a photovoltaic element (a solar cell). The reason for this is considered such that when negative charges generated at the surface of the semiconductor layer (44) are flown from the semiconductor layer toward the side of the electrically conductive substrate 124 during the formation of the transparent and electrically conductive film (45), they are convergently flown through an electrically weak portion (which is lower than its periphery in terms of electric resistance) and as a result, the electrically weak portion is short-circuited.

On the other hand, for the photovoltaic elements (the solar cells) prepared by making the self-bias voltage (V-self) between the electrically conductive substrate 124 and the deposition chamber 12 to be less than −100 volts (that is, self-V<−100 volts), any of them is interior in the characteristics required for a photovoltaic element (a solar cell), particularly, any of them is significantly inferior in terms of the open-circuit voltage (Voc) with low illumination. The reason for this is considered such that the semiconductor layer (44) is greatly suffered from plasma damage due to ions flown thereto during the formation of the transparent and electrically conductive film (45).

EXAMPLE 2

In this example, there were prepared a plurality of triple cell type photovoltaic elements having such configuration as shown in FIG. 4 using the ion beam sputtering shown in FIG. 3.

1. Provision of Electrically Conductive Substrate Web 31:

There were provided eleven well-cleaned long substrate web (corresponding to the substrate 41 in FIG. 4) made of stainless steel (SUS 430 BA) of 0.2 mm in thickness and 30 cm in width and having an uneven surface applied with bright anneal treatment.

For each of the eleven stainless steel substrate webs, on the uneven surface thereof, a 100 nm thick Al film as a reflection layer (42) was formed by means of the conventional sputtering process using a roll-to-roll film-forming system, followed by forming a 1 μm thick ZnO film as a lower transparent and electrically conductive film (43) by means of the conventional DC magnetron sputtering process using a roll-to-roll film-forming system.

Each of the eleven stainless steel substrate webs having the reflection layer (42) and the lower transparent and electrically conductive film (43) thereon was introduced into the conventional roll-to-roll type plasma CVD film-forming apparatus having nine plasma CVD deposition chambers connected to each other through gas gates (described in U.S. Pat. No. 5,266,116), wherein while continuously moving the stainless steel substrate web, there was formed a multi-layered semiconductor layer (44) on the lower transparent and electrically conductive film (43), said multi-layered semiconductor layer (44) comprising a bottom cell comprising a 10 nm thick n-type a-Si semiconductor layer (419)/a 200 nm thick i-type a-SiGe semiconductor layer (418)/a 5 nm thick p-type μc-Si semiconductor layer (417), a middle cell comprising a 10 nm thick n-type a-Si semiconductor layer (416)/a 100 nm thick i-type a-SiGe semiconductor layer (415)/a 5 nm thick p-type μc-Si semiconductor layer (414), and a top cell comprising a 10 nm thick n-type a-Si semiconductor layer (413)/a 70 nm thick i-type a-Si semiconductor layer (412)/a 5 nm thick p-type μc-Si semiconductor layer (411) being stacked in the named order from the substrate side. Wherein, the n-type a-Si semiconductor layer in each of the three cells was formed from a mixture of $SiH_4$ gas, $PH_3$ gas and $H_2$ gas by means of RF plasma CVD; the p-type μc-Si semiconductor layer in each of the three cells was formed from a mixture of $SiH_4$ gas, $BF_3$ gas and $H_2$ gas by means of RF plasma CVD; the i-type a-SiGe semiconductor layer in each of the bottom and middle cells was formed from a mixture of $SiH_4$ gas, $GeH_4$ gas and $H_2$ gas by means of microwave plasma CVD; and the i-type a-Si semiconductor layer in the top cell was formed from a mixture of $SiH_4$ gas, and $H_2$ gas by means of microwave plasma CVD.

Thus, there were provided eleven stainless substrate webs each having the above-described semiconductor layer (44) thereon as the electrically conductive substrate web 31.

2. Formation of Transparent and Electrically Conductive Film (45):

On the semiconductor layer (44) of each of the eleven electrically conductive substrate webs 31 provided in the above step 1, an about 70 nm thick transparent and electrically conductive film (45) comprising ITO was formed using the roll-to-roll ion beam sputtering apparatus shown in FIG. 3 in which the target 352 comprises a pellet-like shaped target comprising a sintered compact of a mixture composed of $In_2O_3$ (90 wt. %) and $SnO_2$ (10 wt. %).

The formation of the transparent and electrically conductive film (45) on the semiconductor layer (44) of each of the eleven electrically conductive substrate webs 31 was conducted by changing the self-bias voltage (V-self) between the electrically conductive substrate web 31 and the deposition chamber 35 in the range of −120 volts to +20 volts as shown in Table 1.

The formation of the transparent and electrically conductive film (45) on the semiconductor layer (44) of each of the electrically conductive substrate webs 31 using the roll-to-roll ion beam sputtering apparatus shown in FIG. 3 was conducted as will be described in the following.

Herein, in the ion beam sputtering apparatus shown in FIG. 3, in order for the electrically conductive substrate web 31 to be electrically insulated to the earth, the surface of each of the pay-out reel 331, the feed rollers 332 and 334, and the take-up reel 341, which is contacted with the electrically conductive substrate web 31, was covered by an insulative film of polyimide affixed thereon using a double-coated adhesive tape (not shown). And the deposition chamber 35 was made to be in an electrically floated state.

(1). The electrically conductive substrate web 31 was wound on the pay-out reel 341. The pay-out reel 341 having the electrically conductive substrate web 31 wound thereon was set in the load chamber 34 of the ion beam sputtering apparatus shown in FIG. 3. The electrically conductive substrate web 31 was paid out from the pay-out reel, while being guided by the feed roller 332, it was passed through the gas gate between the load chamber 33 and the deposition chamber 35, the deposition chamber 35 and the gas gate between the deposition chamber 35 and the unload chamber 34, and fixed to the take-up reel 341 in the unload chamber 34 while being guided by the feed roller 342. Wherein, the electrically conductive substrate web 31 was adjusted not to have any loosing part.

(2). The electric resistance between the electrically conductive substrate web 31 and the deposition chamber 35 was measured using a tester. As a result, the electric resistance between the electrically conductive substrate web 31 and the deposition chamber 35 was found to be more than 300 kΩ. By this, the electrically conductive substrate web 31 situated in the deposition chamber 35 was found to be in an electrically insulated state to the earth potential of the deposition chamber 35 and the like.

(3). The inside of the vacuum vessel 114 of the ion beam generating equipment 11 (not shown in FIG. 3) was evacuated to a desired vacuum, followed by further evacuating to a high vacuum of about $10^{-6}$ Torr, through the exhaust pipe (not shown) having the exhaustion valve (not shown) provided at the vacuum vessel, by actuating the vacuum pump (not shown) connected to the exhaust pipe.

Thereafter, Ar gas was introduced into the vacuum vessel 114 through the gas supply pipe 111. The gas pressure in the vacuum vessel 114 was adjusted to $3 \times 10^{-4}$ Torr. In this case, oxygen gas ($O_2$) was additionally introduced into the vacuum vessel 114 through the gas supply pipe 111 so that the partial pressure of the oxygen gas in the vacuum vessel 114 became $1 \times 10^{-5}$ Torr.

(4). The deposition chamber 35 was also evacuated to and maintained at a desired vacuum through the exhaust pipe (not shown) having the exhaustion valve (not shown) provided at the deposition chamber 35 by actuating the vacuum pump (not shown) connected to the exhaust pipe. And the heater 125 was adjusted so that the indication of the thermocouple 127 positioned just above the electrically conductive substrate web 31 was 200° C. After an hour since the actuation of the heater 125, the electrically conductive substrate web 31 was started moving from the load chamber 33 toward the unload chamber 34. The transportation speed of the electrically conductive substrate web 31 was made to be 50 cm/minute.

(5). The heater 112 in the vacuum vessel 114 was energized by the power source (not shown) electrically connected to the heater 112, where the Ar and $O_2$ gases introduced into the vacuum vessel 114 were excited to generate ions of Ar and O, the ions generated were successively flown to pass through the accelerator 113 having the slit mechanism where they were accelerated into ion beams, which were followed by ejecting into the deposition chamber 35. The ion beams thus ejected into the deposition chamber 35 were successively impinged to the target 351, where the target was sputtered by the ion beams to produce a target component, which was followed by reaching to the electrically conductive substrate web 31, where the target component was deposited to cause the formation of a transparent and electrically conductive film (45) on the semiconductor layer (44) of the electrically conductive substrate 31. During the film formation, the deposition chamber 35 was electrically floated.

In the above film-forming process in each case, the film-forming pressure (the gas pressure) in the deposition chamber 35 was made to be a different gas pressure of $1\times10^{-5}$ Torr, $2\times10^{-5}$ Torr, $3\times10^{-5}$ Torr, $5\times10^{-5}$ Torr, $8\times10^{-5}$ Torr, $2\times10^{-4}$ Torr, $5\times10^{-4}$ Torr, or $5\times10^{-3}$ Torr as shown in Table 1 by adjusting the ion inducing voltage and ion beam current by controlling the power applied to the heater 112 and also by adjusting the flow rate of each of the Ar gas and the oxygen gas introduced into the vacuum vessel 114 or/and the opening of the exhaustion valve of the vacuum vessel 114, while making the self-bias voltage (V-self) between the electrically conductive substrate web and the deposition chamber 35 to be a different V-self of −120 volts, −110 volts, −100 volts, −80 volts, −60 volts, −40 volts, −20 volts, −5 volts, 0 volt (the same as the earth potential), +5 volts, or +20 volts as shown in Table 1 by applying a prescribed DC voltage to the electrically conductive substrate web 31 by means of the voltage applying means 21.

In this way, there were prepared eleven photovoltaic elements having the configuration shown in FIG. 4 respectively formed on the electrically conductive substrate web 31. Each electrically conductive substrate web was intermittently cut at an interval of 20 m to obtain a plurality of photovoltaic elements of 30 cm×30 cm in size. One of the resultant photovoltaic elements in each case was randomly selected and it was used for evaluation and also for the preparation of a solar cell. Hence, there were obtained eleven different photovoltaic elements.

For each photovoltaic element, its open-circuit voltage (Voc) under condition of irradiating light from a fluorescent lamp of 200 lux was measured in accordance the conventional measuring manner of open-circuit voltage. The measured results obtained are graphically shown in FIG. 7.

(6). On the surface of the transparent and electrically conductive film (45) of each of the eleven photovoltaic elements obtained in the above step (5), there was formed a comb-shaped collecting electrode by screen-printing an Ag-paste thereon. By this, there were obtained eleven solar cells.

For each of the resultant eleven solar cells, its photovoltaic conversion efficiency (after having been once light-degraded) under condition of irradiating pseudo sunlight of AM 1.5 (100 mW/cm$^2$) was measured in accordance with the conventional measuring manner of photoelectric conversion efficiency. The measured results obtained are graphically shown in FIG. 8.

Figure 7:
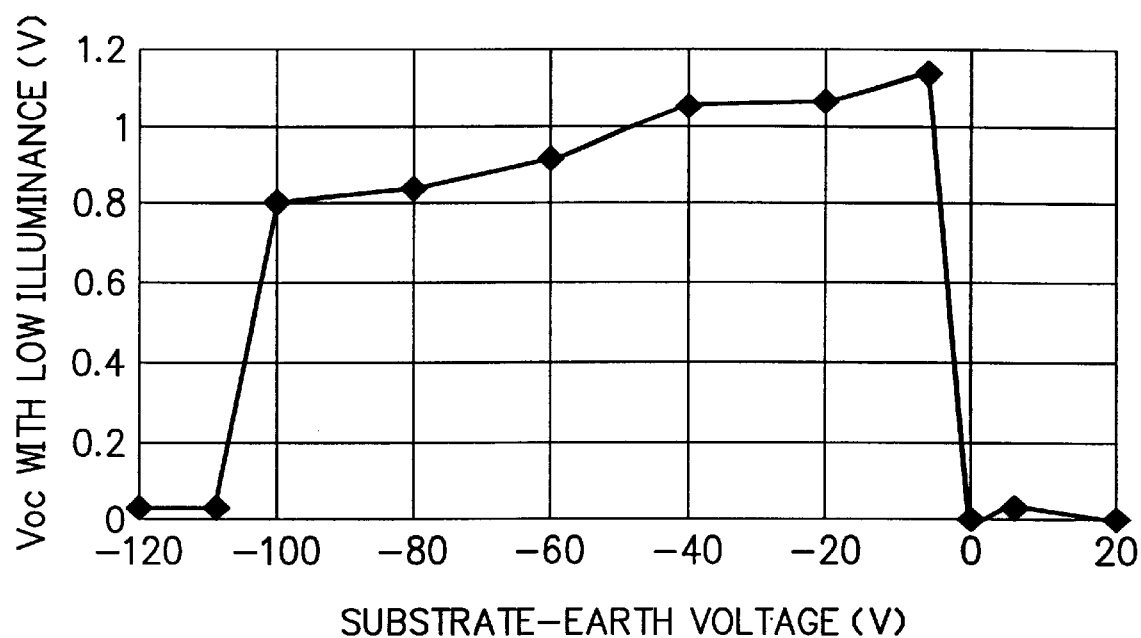
FIG. 7 is a graph showing open-circuit voltages (Voc) of photovoltaic elements obtained in Example 2 which will be described later.
Figure 8:
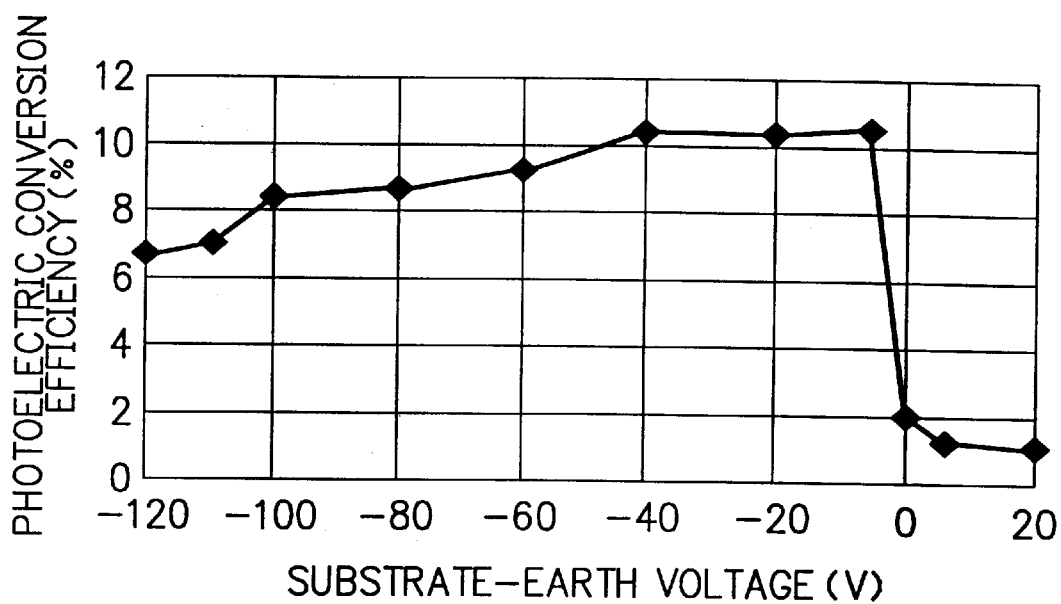
FIG. 8 is a graph showing photoelectric conversion efficiencies of photovoltaic elements obtained in Example 2 which will be described later.

3. Total Evaluation:

Based on the results shown in FIGS. 7 and 8, the following facts are understood.

For the photovoltaic elements (the solar cells) prepared by making the self-bias voltage (V-self) between the electrically conductive substrate web 31 and the deposition chamber 35 to be 0 volt (that is, the same as the earth potential) or more, specifically in the range of 0 volt to +20 volts, any of them is significantly interior in the characteristics required for a photovoltaic element (a solar cell). The reason for this is considered such that when negative charges generated at the surface of the semiconductor layer (44) are flown from the semiconductor layer toward the side of the electrically conductive substrate 31 during the formation of the transparent and electrically conductive film (45), they are convergently flown through an electrically weak portion (which is lower than its periphery in terms of electric resistance) and as a result, the electrically weak portion is short-circuited.

On the other hand, for the photovoltaic elements (the solar cells) prepared by making the self-bias voltage (V-self) between the electrically conductive substrate 31 and the deposition chamber 35 to be less than −100 volts (that is, self-V<−100 volts), any of them is interior in the characteristics required for a photovoltaic element (a solar cell), particularly, any of them is significantly inferior in terms of the open-circuit voltage (Voc) with low illumination. The reason for this is considered such that the semiconductor layer (44) is greatly suffered from plasma damage due to ions flown thereto during the formation of the transparent and electrically conductive film (45).

EXAMPLE 3

In this example, there was prepared a triple cell type photovoltaic element having such configuration as shown in FIG. 4 using the ion beam sputtering shown in FIG. 3.

1. Provision of Electrically Conductive Substrate 31:

There was provided a well-cleaned long substrate web (corresponding to the substrate 41 in FIG. 4) made of stainless steel (SUS 430 BA) of 0.2 mm in thickness and 30 cm in width and having an uneven surface applied with bright anneal treatment.

On the uneven surface of the stainless steel substrate web, there were sequentially formed a reflection layer (42) [comprising a 100 nm thick Al film], a lower transparent and electrically conductive film (43) [comprising a 1 m thick ZnO film], and a multi-layered semiconductor layer (44) [comprising a bottom cell comprising a 10 nm thick n-type a-Si semiconductor layer (419)/a 200 nm thick i-type a-SiGe semiconductor layer (418)/a 5 nm thick p-type μc-Si semiconductor layer (417), a middle cell comprising a 10 nm thick n-type a-Si semiconductor layer (416)/a 100 nm thick i-type a-SiGe semiconductor layer (415)/a 5 nm thick p-type μc-Si semiconductor layer (414), and a top cell comprising a 10 nm thick n-type a-Si semiconductor layer (413)/a 70 nm thick i-type a-Si semiconductor layer (412)/a 5 nm thick p-type μc-Si semiconductor layer (411) being stacked in the named order from the substrate side] in the same manner as in the step 1 (provision of electrically conductive substrate web 31) of Example 2.

Thus, there was provided a stainless substrate web having the above-described semiconductor layer (44) thereon as the electrically conductive substrate web 31.

2. Formation of Transparent and Electrically Conductive Film:

On the semiconductor layer (44) of the electrically conductive substrate web 31, an about 70 nm thick transparent and electrically conductive film (45) comprising ITO was formed in the same manner for the formation of the transparent and electrically conductive film (45) using the apparatus shown in FIG. 3 in the step 2 of Example 2, except for the following points.

The electrically conductive substrate web 31 was made have a high impedance without using the voltage applying means 21.

The gas pressure in the vacuum vessel 114 into which the Ar gas was introduced was made to be 0.2 mTorr.

The indication of the thermocouple 127 positioned just above the electrically conductive substrate web 31 was made to be 180° C.

As a result of observing the self-bias voltage (V-self) between the electrically conductive substrate web 31 and the deposition chamber 35 during the film formation by means of a tester, it was found to be −15 volts. In view of this, the film formation was considered to have been conducted while the V-self being maintained substantially at −15 volts.

In this way, there was prepared a photovoltaic element having the configuration shown in FIG. 4 formed on the electrically conductive substrate web 31.

This electrically conductive substrate web was intermittently cut at an interval of 20 m to obtain a plurality of photovoltaic elements of 30 cm×30 cm in size.

For each of the resultant photovoltaic elements, its open-circuit voltage (Voc) under condition of irradiating light from a fluorescent lamp of 200 lux was measured in accordance the conventional measuring manner of open-circuit voltage. As a result, these photovoltaic elements were found to have an open-circuit voltage of 0.46±0.03 volts which is good enough.

Then, on the surface of the transparent and electrically conductive film (45) of each of the photovoltaic elements obtained in the above, there was formed a comb-shaped collecting electrode by screen-printing an Ag-paste thereon. By this, there were obtained a plurality of solar cells.

For each of the resultant solar cells, its photovoltaic conversion efficiency (after having been once light-degraded) under condition of irradiating pseudo sunlight of AM 1.5 (100 mW/cm$^2$) was measured in accordance with the conventional measuring manner of photoelectric conversion efficiency. As a result, these solar cells were found to have a photoelectric conversion efficiency of 7.3±0.2% which is good enough.

COMPARATIVE EXAMPLE 1

In this example, there was prepared a triple cell type photovoltaic element having such configuration as shown in FIG. 4 using the ion beam sputtering shown in FIG. 3.

1. Provision of Electrically Conductive Substrate 31:

There was provided a well-cleaned long substrate web (corresponding to the substrate 41 in FIG. 4) made of stainless steel (SUS 430 BA) of 0.2 mm in thickness and 30 cm in width and having an uneven surface applied with bright anneal treatment.

On the uneven surface of the stainless steel substrate web, there were sequentially formed a reflection layer (42) (comprising a 100 nm thick Al film), a lower transparent and electrically conductive film (43) (comprising a 1 $\mu$m thick ZnO film), and a multi-layered semiconductor layer (44) [comprising a bottom cell comprising a 10 nm thick n-type a-Si semiconductor layer (419)/a 200 nm thick i-type a-SiGe semiconductor layer (418)/a 5 nm thick p-type $\mu$c-Si semiconductor layer (417), a middle cell comprising a 10 nm thick n-type a-Si semiconductor layer (416)/a 100 nm thick i-type a-SiGe semiconductor layer (415)/a 5 nm thick p-type $\mu$c-Si semiconductor layer (414), and a top cell comprising a 10 nm thick n-type a-Si semiconductor layer (413)/a 70 nm thick i-type a-Si semiconductor layer (412)/a 5 nm thick p-type $\mu$c-Si semiconductor layer (411) being stacked in the named order from the substrate side] in the same manner as in the step 1 (provision of electrically conductive substrate web 31) of Example 2.

Thus, there was provided a stainless substrate web having the above-described semiconductor layer (44) thereon as the electrically conductive substrate web 31.

2. Formation of Transparent and Electrically Conductive Film:

on the semiconductor layer (44) of the electrically conductive substrate web 31, an about 70 nm thick transparent and electrically conductive film (45) comprising ITO was formed in the same manner for the formation of the transparent and electrically conductive film (45) using the apparatus shown in FIG. 3 in the step 2 of Example 2, except for the following points.

The surface of each of the pay-out reel 331, the feed rollers 332 and 334, and the take-up reel 341 was not covered by the insulative film as in Example 2.

The deposition chamber 35 was electrically grounded, and the voltage applying means 21 was not used.

In this way, there was prepared a photovoltaic element having the configuration shown in FIG. 4 formed on the electrically conductive substrate web 31.

This electrically conductive substrate web was intermittently cut at an interval of 20 m to obtain a plurality of photovoltaic elements of 30 cm×30 cm in size.

Then, on the surface of the transparent and electrically conductive film (45) of each of the photovoltaic elements obtained in the above, there was formed a comb-shaped collecting electrode by screen-printing an Ag-paste thereon. By this, there were obtained a plurality of solar cells.

For each of the resultant solar cells, its photovoltaic conversion efficiency (after having been once light-degraded) under condition of irradiating pseudo sunlight of AM 1.5 (100 mW/cm$^2$) was measured in accordance with the conventional measuring manner of photoelectric conversion efficiency. As a result, these solar cells were found to have a photoelectric conversion efficiency of at most 2.0% which is apparently inferior.

For the solar cell having the largest photoelectric conversion efficiency of 2.0%, a direct current of 20 mA was flown between the collecting electrode (as a positive electrode) and the electrically conductive substrate (as a negative electrode), where the surface of the solar cell (the photovoltaic element) was examined by means of an IR camera. As a result, the surface of the solar cell (the photovoltaic element) was found to have current paths in the entirety of the surface.

The reason for this is considered such that because the electrically conductive substrate web 31 was electrically connected to the electrically grounded deposition chamber 35 upon the formation of the transparent and electrically film (45) on the semiconductor layer (44), charges generated at the surface of the semiconductor layer (44) were flown from the semiconductor layer toward the substrate side, where the charges were convergently flown through an electrically weak portion (having an electric resistance which is lower than that of its periphery) and as a result, the electrically weak portion was short-circuited.

COMPARATIVE EXAMPLE 2

In this example, there was prepared a triple cell type photovoltaic element having such configuration as shown in FIG. 4 using the ion beam sputtering shown in FIG. 3.

1. Provision of Electrically Conductive Substrate 31:

There was provided a well-cleaned long substrate web (corresponding to the substrate 41 in FIG. 4) made of stainless steel (SUS 430 BA) of 0.2 mm in thickness and 30 cm in width and having an uneven surface applied with bright anneal treatment.

On the uneven surface of the stainless steel substrate web, there were sequentially formed a reflection layer (42) (comprising a 100 nm thick Al film), a lower transparent and electrically conductive film (43) [comprising a 1 μm thick ZnO film], and a multi-layered semiconductor layer (44) [comprising a bottom cell comprising a 10 nm thick n-type a-Si semiconductor layer (419)/a 200 nm thick i-type a-SiGe semiconductor layer (418)/a 5 nm thick p-type μc-Si semiconductor layer (417), a middle cell comprising a 10 nm thick n-type a-Si semiconductor layer (416)/a 100 nm thick i-type a-SiGe semiconductor layer (415)/a 5 nm thick p-type μc-Si semiconductor layer (414), and a top cell comprising a 10 nm thick n-type a-Si semiconductor layer (413)/a 70 nm thick i-type a-Si semiconductor layer (412)/a 5 nm thick p-type μc-Si semiconductor layer (411) being stacked in the named order from the substrate side] in the same manner as in the step 1 (provision of electrically conductive substrate web 31) of Example 2.

Thus, there was provided a stainless substrate web having the above-described semiconductor layer (44) thereon as the electrically conductive substrate web 31.

2. Formation of Transparent and Electrically Conductive Film:

On the semiconductor layer (44) of the electrically conductive substrate web 31, an about 70 nm thick transparent and electrically conductive film (45) comprising ITO was formed in the same manner for the formation of the transparent and electrically conductive film (45) using the apparatus shown in FIG. 3 in the step 2 of Example 2, except for the following points.

The electrically conductive substrate web 31 was made have a high impedance without using the voltage applying means 21.

The gas pressure in the vacuum vessel 114 into which the Ar gas was introduced was made to be $1.5 \times 10^{-5}$ Torr.

The transportation speed of the electrically conductive substrate web 31 upon the film formation was made to be 70 cm/minute.

The indication of the thermocouple 127 positioned just above the electrically conductive substrate web 31 was made to be 180° C.

As a result of observing the self-bias voltage (V-self) between the electrically conductive substrate web 31 and the deposition chamber 35 during the film formation by means of a tester, it was found to be –110 volts. In view of this, the film formation was considered to have been conducted while the V-self being maintained substantially at –110 volts.

In this way, there was prepared a photovoltaic element having the configuration shown in FIG. 4 formed on the electrically conductive substrate web 31.

This electrically conductive substrate web was intermittently cut at an interval of 20 m to obtain a plurality of photovoltaic elements of 30 cm×30 cm in size.

For each of the resultant photovoltaic elements, its open-circuit voltage (Voc) under condition of irradiating light from a fluorescent lamp of 200 lux was measured in accordance the conventional measuring manner of open-circuit voltage. As a result, 80% of these photovoltaic elements were found to have an open-circuit voltage of less than 0.05 volts which is apparently inferior.

Then, on the surface of the transparent and electrically conductive film (45) of each of the photovoltaic elements obtained in the above, there was formed a comb-shaped collecting electrode by screen-printing an Ag-paste thereon. By this, there were obtained a plurality of solar cells.

For each of the resultant solar cells, its photovoltaic conversion efficiency (after having been once light-degraded) under condition of irradiating pseudo sunlight of AM 1.5 (100 mW/cm$^2$) was measured in accordance with the conventional measuring manner of photoelectric conversion efficiency. As a result, the solar cells corresponding to the foregoing 80% photovoltaic elements were found to have a photoelectric conversion efficiency of at most 3.5% which is apparently inferior.

For the solar cell having the largest photoelectric conversion efficiency of 3.5%, a direct current of 20 mA was flown between the collecting electrode (as a positive electrode) and the electrically conductive substrate (as a negative electrode), where the surface of the solar cell (the photovoltaic element) was examined by means of an IR camera. As a result, the surface of the solar cell (the photovoltaic element) was found to have ball-like shaped current paths of about 30 mm in diameter spacedly present in the surface.

The reason for this is considered such that upon the formation of the transparent and electrically film (45) on the semiconductor layer (44), ions of ITO produced as a result of the ionization by the ion beams would have caused plasma damage to the semiconductor layer (44) to result in short-circuited portions in the semiconductor layer (44).

In the above examples, as the semiconductor layer on which the transparent and electrically conductive film is formed, there has been described only the semiconductor layer with three semiconductor junctions used in the photovoltaic element shown in FIG. 4. This is only for illustrative purposes and therefore, is not limitative.

The semiconductor layer on which the transparent and electrically conductive film is formed in the present invention can include any other semiconductor layers having one or more semiconductor junctions of pin, nip, pn, or np used in semiconductor devices including photoelectric conversion devices such as photovoltaic elements (solar cells).

Besides, the semiconductor layer on which the transparent and electrically conductive film is formed in the present invention can include semiconductor layers for thin film transistors (TFT) used in liquid crystal panels operated by way of active matrix driving, and semiconductor layers for such sensors as described in U.S. Pat. Nos. 5,184,018 and 5,262,649.

As above described, according to the present invention in which a transparent and electrically conductive film is formed on a given semiconductor layer formed on an electrically conductive substrate by making the electrically conductive substrate to in a non-earth connection state by way of electric connection with a high impedance or with a potential corresponding to the self-bias using any of the foregoing ion beam sputtering apparatus, direct current is hardly flown from the electrically conductive substrate toward the surface of the semiconductor layer where the semiconductor layer is prevented from suffering from short-circuit, whereby the transparent and electrically conductive film is formed in a desirable state on the semiconductor layer.

Further, by making the electrically conductive substrate such that it has a potential (a voltage) of –100 volts to 0 volt to the earth upon the film formation by way of the ion beam sputtering, the semiconductor layer is desirably prevented from suffering from plasma damage due to ions upon the formation of the transparent and electrically conductive film on the semiconductor layer. In this case, the transparent and electrically conductive film, which is formed on the semiconductor layer, comprises grains having a substantially uniform size densely distributed therein and which has a desirably low electric resistance and a high light-transmittance, excels in acid proof and alkali proof, stands with high temperature, and is always stable even upon repeated use over a long period of time.

In addition, in the present invention, upon the formation of a transparent and electrically conductive film on a semiconductor layer on an electrically conductive substrate, the sputtering chamber (the deposition chamber) is maintained at a higher vacuum than that in case of the DC magnetron sputtering process by way of glow discharge and because of this, the transparent and electrically conductive film formed on the semiconductor layer in the present invention is free of the contamination of glow-discharged gas which is often found in the case of the DC magnetron sputtering process, and it is high in purity, desirably low in electric resistance, and highly transparent.

TABLE 1

| self-bias voltage (volt) | film-forming pressure (Torr) |
|---|---|
| −120 | $1 \times 10^{-5}$ |
| −110 | $2 \times 10^{-5}$ |
| −100 | $3 \times 10^{-5}$ |
| −80 | $5 \times 10^{-5}$ |
| −60 | $8 \times 10^{-5}$ |
| −40 | $2 \times 10^{-5}$ |
| −20 | $5 \times 10^{-5}$ |
| −5,0,+5,+20 | $5 \times 10^{-5}$ |

What is claimed is:

1. A method for forming a transparent and electrically conductive film on an electrically conductive substrate having a semiconductor layer thereon, said method comprising the steps of:
   (a) arranging a target at a position in a deposition chamber of an ion beam sputtering apparatus where said target is irradiated with an ion beam,
   (b) arranging said electrically conductive substrate at a position in said deposition chamber of said ion beam sputtering apparatus where a component sputtered from said target is deposited on said semiconductor layer of said electrically conductive substrate, and
   (c) generating said ion beam and directing the ion beam generated in a prescribed direction to irradiate the ion beam to said target to sputter the target thereby depositing the component sputtered from the target on the semiconductor layer of the electrically conductive substrate thereby forming said transparent and electrically conductive film on the semiconductor layer,
   wherein at least during when the component sputtered from the target is being deposited on the semiconductor layer of the electrically conductive substrate in said step (c), the electrically conductive substrate is controlled to a non-earth potential, and a voltage in a range of −100 volts to 0 volt is applied to the electrically conductive substrate while imparting to a surface of the semiconductor layer on which the component sputtered from the target is deposited a negative potential to earth and maintaining a self-bias voltage between said electrically conductive substrate and said deposition chamber at a desired value in a range of −100 volts to 0 volt during ion beam sputtering.

2. A method according to claim 1, wherein the electrically conductive substrate is an elongated electrically conductive substrate having a semiconductor layer thereon.

3. A method according to claim 1, wherein the electrically conductive substrate is made to have a desired potential by electrically insulating the electrically conductive substrate from earth.

4. A method according to claim 1, wherein the semiconductor layer has one or more semiconductor junctions.

5. A method according to claim 1, wherein the semiconductor layer is formed of a non-single crystalline silicon semiconductor material, and has one or more semiconductor junctions.

6. A method according to claim 1, wherein the semiconductor layer is formed of one or more materials selected from the group consisting of an amorphous silicon semiconductor material, a microcrystalline silicon semiconductor material and a polycrystalline silicon semiconductor material, and has one or more semiconductor junctions selected from the group consisting of pin, nip, pn and np.

7. The method according to claim 1, wherein the voltage applied to the electrically conductive substrate is in the range from −60 volts to 0 volts.

8. The method according to claim 1, wherein the voltage applied to the electrically conductive substrate is in the range from −40 volts to 0 volts.

9. A process for producing a semiconductor device, said process comprising the steps of:
   (a) arranging a target at a position in a deposition chamber of an ion beam sputtering apparatus where said target is irradiated with an ion beam,
   (b) arranging an electrically conductive substrate having a semiconductor layer for said semiconductor device at a position in said deposition chamber of said ion beam sputtering apparatus where a component sputtered from said target is deposited on said semiconductor layer of said electrically conductive substrate; and
   (c) generating said ion beam and directing the ion beam generated in a prescribed direction to irradiate the ion beam to said target to sputter the target thereby depositing the component sputtered from the target on the semiconductor layer of the electrically conductive substrate thereby forming a transparent and electrically conductive film on the semiconductor layer,
   wherein at least during when the component sputtered from the target is being deposited on the semiconductor layer of the electrically conductive substrate in said step (c), the electrically conductive substrate is controlled to a non-earth potential, and a voltage in a range of −100 volt to 0 volts is applied to the electrically conductive substrate while imparting to a surface of the semiconductor layer on which the component sputtered from the target is deposited a negative potential to earth and maintaining a self-bias voltage between said electrically conductive substrate and said deposition chamber at a desired value in a range of −100 volts to 0 volt during ion beam sputtering.

10. A process according to claim 9, wherein the electrically conductive substrate is an elongated electrically conductive substrate.

11. A process according to claim 9, wherein the electrically conductive substrate is made to have a desired potential by electrically insulating the electrically conductive substrate from earth.

12. A process according to claim 9, wherein the semiconductor layer has one or more semiconductor junctions.

13. A process according to claim 9, wherein the semiconductor layer is formed of a non-single crystalline silicon semiconductor material, and has one or more semiconductor junctions.

14. A process according to claim 9, wherein the semiconductor layer is formed of one or more materials selected from the group consisting of an amorphous silicon semiconductor material, a microcrystalline silicon semiconductor material and a polycrystalline silicon semiconductor material and has one or more semiconductor junctions selected from the group consisting of pin, nip, pn, and np.

15. A process according to claim 9, wherein a transparent and electrically conductive film comprising the component sputtered from the target is formed on the semiconductor layer.

16. A process according to claim 9, wherein the semiconductor device is a photoelectric conversion device.

17. A process according to claim 16, wherein the photoelectric conversion device is a photovoltaic element or a solar cell.

18. A process according to claim 9, wherein the semiconductor device is a thin film transistor.

19. A process according to claim 9, wherein the semiconductor device is a photosensor.

* * * * *

UNITED STATES PATENT AND TRADEMARK OFFICE
CERTIFICATE OF CORRECTION

PATENT NO. : 6,726,812 B2
DATED : April 27, 2004
INVENTOR(S) : Noboru Toyama

It is certified that error appears in the above-identified patent and that said Letters Patent is hereby corrected as shown below:

Title page,
Item [56], References Cited, FOREIGN PATENT DOCUMENTS, "JP   7331413" should read -- JP     07-331413 --.

Column 20,
Line 46, "1  m" should read -- 1  $\mu$m --.

Column 22,
Line 12, "on" should read -- On --.

Signed and Sealed this

Seventeenth Day of August, 2004

JON W. DUDAS
*Acting Director of the United States Patent and Trademark Office*